(12) United States Patent
Liao

(10) Patent No.: US 12,575,197 B2
(45) Date of Patent: *Mar. 10, 2026

(54) PHOTONIC STRUCTURE AND METHODS OF MANUFACTURING

(71) Applicant: Taiwan Semiconductor Manufacturing Company, Ltd., Hsinchu (TW)

(72) Inventor: Shih-Yu Liao, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 313 days.

This patent is subject to a terminal disclaimer.

(21) Appl. No.: 18/447,110

(22) Filed: Aug. 9, 2023

(65) Prior Publication Data

US 2025/0056905 A1 Feb. 13, 2025

(51) Int. Cl.
*H10F 39/00* (2025.01)

(52) U.S. Cl.
CPC ....... *H10F 39/021* (2025.01); *H10F 39/8033* (2025.01); *H10F 39/8063* (2025.01)

(58) Field of Classification Search
CPC .... H10F 39/8033; H10F 39/021; H10F 39/80; H01L 27/1461; H01L 27/14694; H01L 27/14603; H01L 27/14607
See application file for complete search history.

(56) References Cited

U.S. PATENT DOCUMENTS

| | | | | |
|---|---|---|---|---|
| 7,619,267 | B2 * | 11/2009 | Araki | .................. H10F 39/1825 |
| | | | | 257/292 |
| 7,883,916 | B2 * | 2/2011 | Gambino | ............ H10F 39/1825 |
| | | | | 438/57 |
| 10,462,402 | B2 | 10/2019 | Fan | |
| 10,825,858 | B2 | 11/2020 | Yanagita et al. | |
| 11,974,444 | B2 | 4/2024 | Togashi et al. | |
| 12,063,801 | B2 | 8/2024 | Murata et al. | |
| 2012/0018620 | A1 | 1/2012 | Qian et al. | |
| 2023/0008784 | A1 | 1/2023 | Nishida | |
| 2025/0056906 | A1 * | 2/2025 | Liao | ..................... H10F 39/8033 |
| 2025/0063838 | A1 * | 2/2025 | Liao | ..................... H10F 39/014 |
| 2025/0221091 | A1 * | 7/2025 | Liao | ..................... H10F 77/413 |

FOREIGN PATENT DOCUMENTS

| | | |
|---|---|---|
| TW | 201613084 A | 4/2016 |
| TW | 201622116 A | 6/2016 |
| TW | 202013701 A | 4/2020 |
| TW | 202018927 A | 5/2020 |
| TW | 202133413 A | 9/2021 |

* cited by examiner

*Primary Examiner* — Lauren R Bell
(74) *Attorney, Agent, or Firm* — Harrity & Harrity, LLP

(57) ABSTRACT

Some implementations described herein provide an optoelectronic device including a multi-layer photodiode structure. The multi-layer photodiode structure includes a stacked configuration of multiple sensing structures formed from quantum effect materials (e.g., a germanium material). By using the stacked configuration of multiple sensing structures, a quantum effect length is increased relative to another photodiode including a single layer photodiode structure. Furthermore, a lower sensing structure of the multi-layer sensing structure shares a substrate with integrated circuitry of the optoelectronic device. The lower sensing structure is electrically isolated from the integrated circuitry by doped isolation regions adjacent to sidewalls of the lower sensing structure.

20 Claims, 12 Drawing Sheets

| | | | |
|---|---|---|---|
| 202d | 202c | 202d | 202c |
| 202a | 202b | 202a | 202b |
| 202d | 202c | 202d | 202c |
| 202a | 202b | 202a | 202b |

202

200

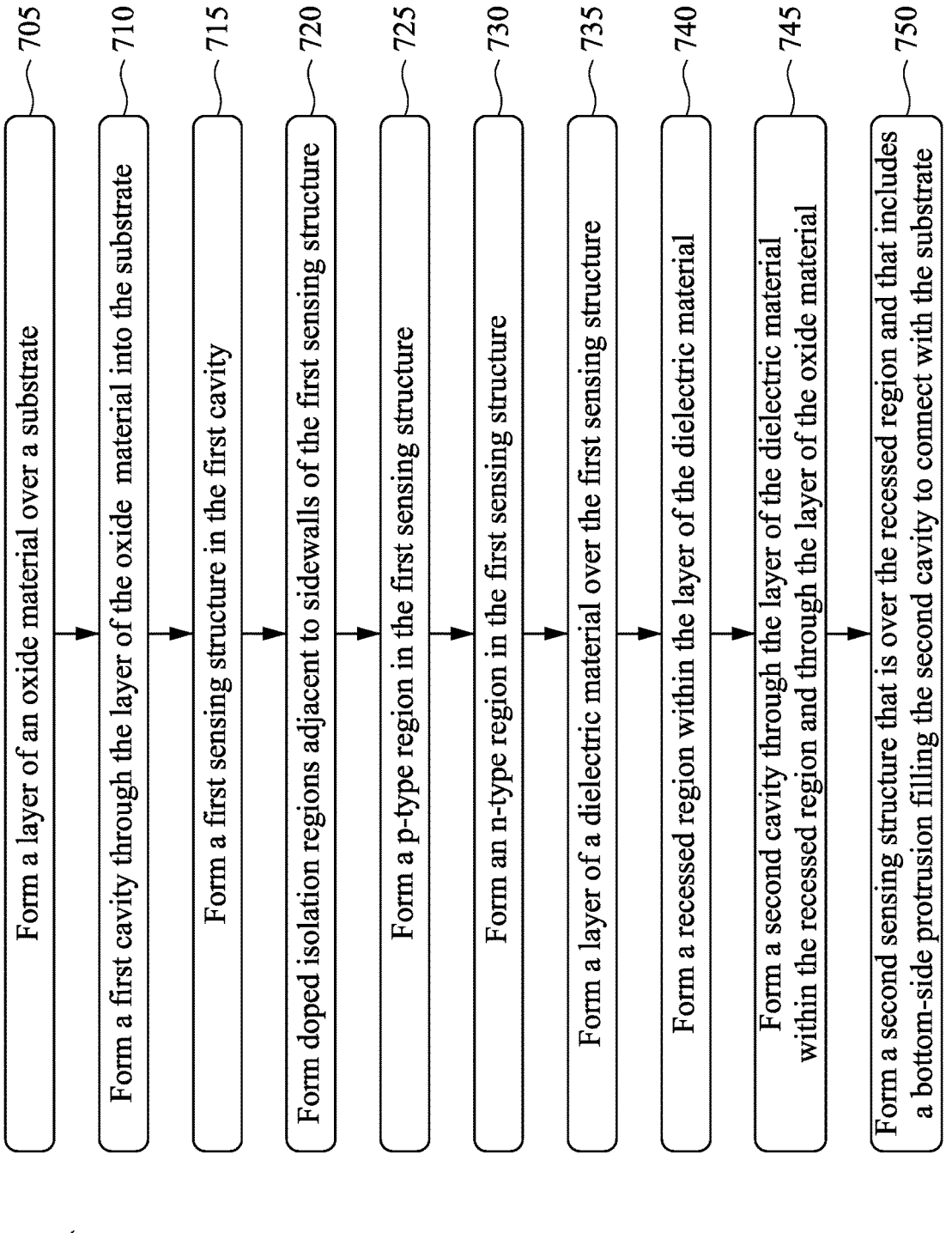

700

705 — Form a layer of an oxide material over a substrate

710 — Form a first cavity through the layer of the oxide material into the substrate 715 — Form a first sensing structure in the first cavity 720 — Form doped isolation regions adjacent to sidewalls of the first sensing structure 725 — Form a p-type region in the first sensing structure 730 — Form an n-type region in the first sensing structure 735 — Form a layer of a dielectric material over the first sensing structure 740 — Form a recessed region within the layer of the dielectric material 745 — Form a second cavity through the layer of the dielectric material within the recessed region and through the layer of the oxide material 750 — Form a second sensing structure that is over the recessed region and that includes a bottom-side protrusion filling the second cavity to connect with the substrate

FIG. 7

PHOTONIC STRUCTURE AND METHODS OF MANUFACTURING

BACKGROUND

Complementary metal oxide semiconductor (CMOS) image sensor (CIS) devices utilize light-sensitive CMOS circuitry to convert light energy into electrical energy. The light-sensitive CMOS circuitry may include a photodiode structure formed in a silicon substrate. As the photodiode structure is exposed to light, an electrical charge is induced in the photodiode structure (referred to as a photocurrent). The photodiode structure may be coupled to a switching transistor, which is used to sample the charge of the photodiode structure. Colors may be determined by placing filters over the light-sensitive CMOS circuitry.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 7 is a flowchart of an example process associated with forming a multi-layer photodiode structure described herein.

DETAILED DESCRIPTION

Figure 1:
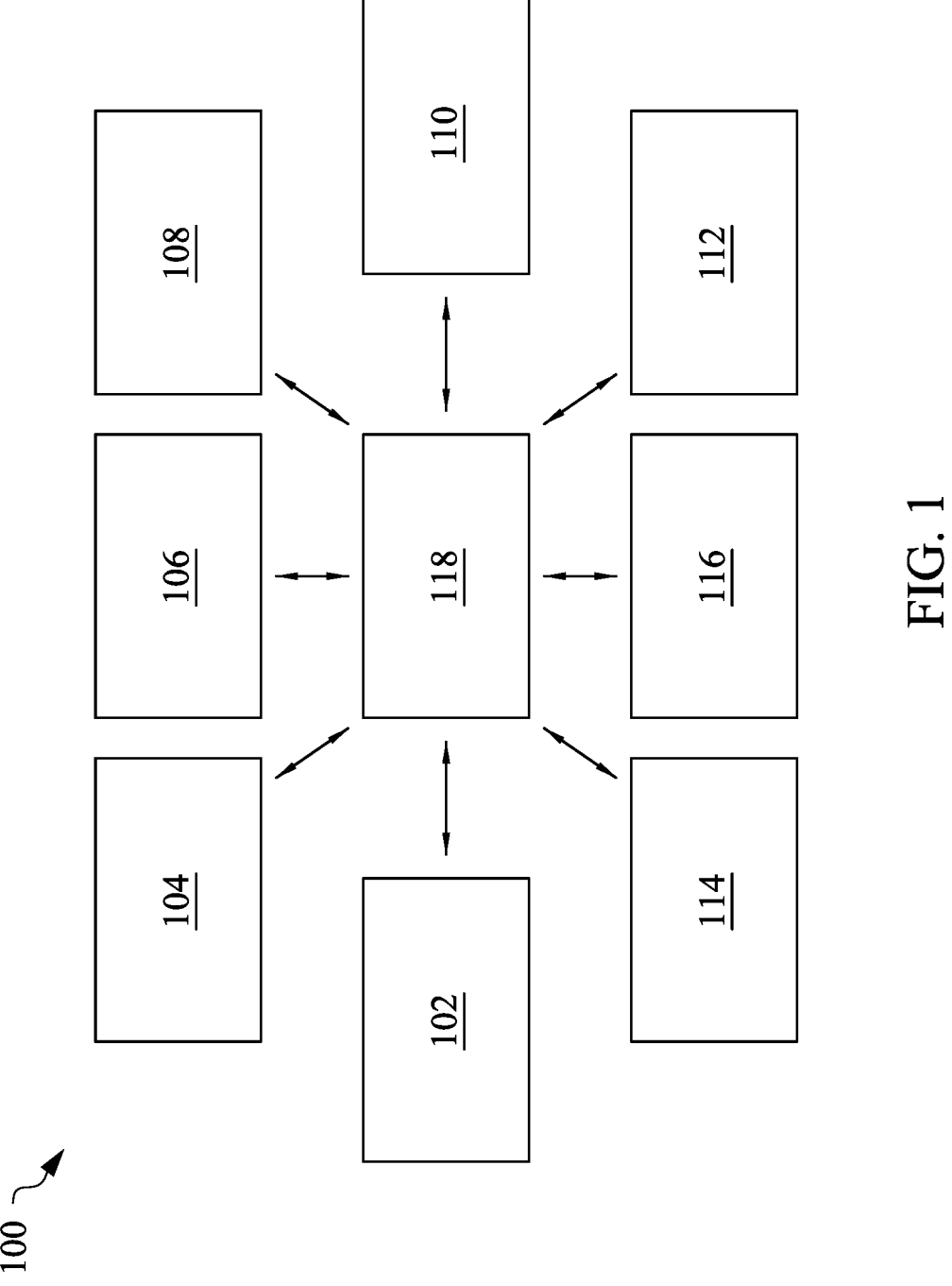
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some cases, a complementary metal-oxide semiconductor image sensor (CIS) device (e.g., an optoelectronic device) includes a photodiode in a first layer of a first semiconductor material and integrated circuitry in a second layer of a second semiconductor material. During manufacturing, formation of the first layer of the first semiconductor material (including the photodiode) and the second layer of the second semiconductor material (including the integrated circuitry) may each, independently, consume an amount of resources (e.g., raw materials, semiconductor manufacturing tools, labor, and/or computing resources). In addition, and within the optoelectronic device, the photodiode may include a p-n junction within a layer of a quantum material such as germanium. Photons from light entering the layer of the quantum material may be absorbed and create electron-hole pairs that are separated by the electric field across the p-n junction, generating a current (e.g., the photocurrent) that can be detected by the integrated circuitry.

A thickness or length of the layer of the quantum material, sometimes referred to as a "quantum length," can impact a performance of the photodiode. For example, if the quantum length of the layer of the quantum material is too short (e.g., the layer of the quantum material is too thin), the photons from the light entering the layer of the quantum material may pass through the layer of the quantum material without being absorbed, thereby reducing a sensitivity and/or energy conversion efficiency of the photodiode.

Some implementations described herein provide an optoelectronic device including a multi-layer photodiode structure. The multi-layer photodiode structure includes a stacked configuration of multiple sensing structures formed from quantum effect materials (e.g., a germanium material). By using the stacked configuration of multiple sensing structures, a quantum effect length is increased relative to another photodiode including a single layer photodiode structure.

Furthermore, a lower sensing structure of the multi-layer sensing structure may share a substrate with integrated circuitry of the optoelectronic device. The lower sensing structure is electrically isolated from the integrated circuitry by doped isolation regions adjacent to sidewalls of the lower sensing structure. Relative to another optoelectronic device including the lower sensing structure and the integrated circuitry on separate substrates, an amount resources (e.g., raw materials, semiconductor manufacturing tools, labor, and/or computing resources), needed to fabricate the optoelectronic device is reduced.

By increasing the quantum length, a performance of an optoelectronic device including the photodiode is increased relative to another optoelectronic device including a photodiode having a single layer of a quantum effect material. In this way, a performance of the optoelectronic device, a quality of the optoelectronic device, and a reliability of the optoelectronic device for a target application and/or environment may increase to improve a manufacturing yield and reduce a rate of field failures. Such an improved manufacturing yield and reduced rate of field failures may extend the resource savings realized though combining the lower sensing structure and the integrated circuitry on the substrate even further.

FIG. 1 is a diagram of an example environment 100 in which systems and/or methods described herein may be implemented. As shown in FIG. 1, environment 100 may include a plurality of semiconductor processing tools 102-116 and a wafer/die transport tool 118. The plurality of semiconductor processing tools 102-116 may include a deposition tool 102, an exposure tool 104, a developer tool 106, an etch tool 108, a planarization tool 110, a plating tool 112, an ion implantation tool 114, a bonding tool/debonding 116, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a low pressure CVD (LPCVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

The ion implantation tool 114 is a semiconductor processing tool that is capable of implanting ions into a substrate. The ion implantation tool 114 may generate ions in an arc chamber from a source material such as a gas or a solid. The source material may be provided into the arc chamber, and an arc voltage is discharged between a cathode and an anode to produce a plasma containing ions of the source material. One or more extraction electrodes may be used to extract the ions from the plasma in the arc chamber and accelerate the ions to form an ion beam. The ion beam may be directed toward the substrate such that the ions are implanted below the surface of the substrate.

The bonding/debonding tool 116 is a semiconductor processing tool that is capable of joining two or more wafers (or two or more semiconductor substrates, or two or more semiconductor devices) together. For example, the bonding/debonding tool 116 may include a eutectic bonding tool that is capable of forming eutectic bond between two or more wafers together. In these examples, the bonding/debonding tool 116 may heat the two or more wafers to form a eutectic system between the materials of the two or more wafers. As another example, the bonding/debonding tool 116 may include a hybrid bonding tool, a direct bonding tool, and/or another type of bonding tool. In some implementations, the bonding/debonding tool 116 may heat the two or more wafers to separate the two or more wafers.

The wafer/die transport tool 118 may be included in a cluster tool or another type of tool that includes a plurality of processing chambers, and may be configured to transport substrates and/or semiconductor devices between the plurality of processing chambers, to transport substrates and/or semiconductor devices between a processing chamber and a buffer area, to transport substrates and/or semiconductor devices between a processing chamber and an interface tool such as an equipment front end module (EFEM), and/or to transport substrates and/or semiconductor devices between a processing chamber and a transport carrier (e.g., a front opening unified pod (FOUP)), among other examples. In some implementations, a wafer/die transport tool 118 may be included in a multi-chamber (or cluster) deposition tool 102, which may include a pre-clean processing chamber (e.g., for cleaning or removing oxides, oxidation, and/or other types of contamination or byproducts from a substrate and/or semiconductor device) and a plurality of types of deposition processing chambers (e.g., processing chambers for depositing different types of materials, processing chambers for performing different types of deposition operations).

One or more of the semiconductor processing tools 102-116 and/or the wafer/die transport tool 118 may perform a series of one or more semiconductor processing operations described herein. In some implementations, and as an example, the series of one or more semiconductor processing operations includes forming a layer of an oxide material over a substrate. The series of one or more semiconductor processing operations includes forming a first cavity through the layer of the oxide material into the substrate. The series of one or more semiconductor processing operations includes forming a first sensing structure in the first cavity. The series of one or more semiconductor processing operations includes forming isolation regions adjacent to sidewalls of the first sensing structure. The series of one or more semiconductor processing operations includes forming a p-type region in the first sensing structure. The series of one or more semiconductor processing operations includes forming an n-type region in the first sensing structure. The series of one or more semiconductor processing operations includes forming a layer of a dielectric material over the first sensing structure. The series of one or more semiconductor processing operations includes forming a recessed region within the layer of the dielectric material. The series of one or more semiconductor processing operations includes forming a second cavity through the layer of the dielectric material within the recessed region and through the layer of the oxide material. The series of one or more semiconductor processing operations includes forming a second sensing structure that is over the recessed region and that includes a bottom-side protrusion filling the second cavity to connect with the substrate, where forming the second sensing structure includes forming the second sensing structure above the first sensing structure. In some implementations, one or more of the semiconductor processing operations performed by the semiconductor processing tools 102-116 and/or the wafer/die transport tool 118 may correspond to one or more semiconductor processing operations described in connection with FIGS. 5A-5M and elsewhere herein, among other examples.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of the example environment 100 may perform one or more functions described as being performed by another set of devices of the example environment 100.

Figure 2:
FIG. 2 is a diagram of an example semiconductor structure described herein.

FIG. 2 shows a top-down view of the pixel array 200. As shown in FIG. 2, the pixel array 200 may include a plurality of pixel sensors 202. As further shown in FIG. 2, the pixel sensors 202 may be arranged in a grid. In some implementations, the pixel sensors 202 are square-shaped (as shown in the example in FIG. 2). In some implementations, the pixel sensors 202 include other shapes such as circle shapes, octagon shapes, diamond shapes, and/or other shapes.

The pixel sensors 202 may be configured to sense and/or accumulate incident light (e.g., light directed toward the pixel array 200). For example, a pixel sensor 202 may absorb and accumulate photons of the incident light in a photodiode structure. The accumulation of photons in the photodiode structure may generate a charge representing the intensity or brightness of the incident light (e.g., a greater amount of charge may correspond to a greater intensity or brightness, and a lower amount of charge may correspond to a lower intensity or brightness).

The pixel array 200 may be electrically connected to a back-end-of-line (BEOL) metallization stack (not shown) of the image sensor. The BEOL metallization stack may electrically connect the pixel array 200 to control circuitry that may be used to measure the accumulation of incident light in the pixel sensors 202 and convert the measurements to an electrical signal.

As described in greater detail in connection with FIGS. 3-7 and elsewhere herein, the pixel sensors 202 may include a combination of light wave filters (e.g., light wave filters to filter targeted wavelengths of light). For example, and using the light wave filters, the pixel sensor 202a may include multi-layer photodiode structures that sense red VIS light waves (e.g., electromagnetic waves having wavelengths that are included in a range of approximately 620 nanometers to approximately 750 nanometers). Additionally, or alternatively, the pixel sensor 202b may include multi-layer photodiode structures that sense blue VIS light waves (e.g., electromagnetic waves having wavelengths that are included in a range of approximately 450 nanometers to approximately 495 nanometers). Additionally, or alternatively, the pixel sensor 202c may include multi-layer photodiode structures that sense green VIS light waves (e.g., electromagnetic waves having wavelengths that are included in a range of approximately 495 nanometers to approximately 570 nanometers). Additionally, or alternatively, the pixel sensor 202d may include multi-layer photodiode structures that sense NIR light waves (e.g., electromagnetic waves having wavelengths that are included in a range of approximately 750 nanometers to approximately 2500 nanometers).

As indicated above, FIG. 2 is provided as an example. Other examples may differ from what is described with regard to FIG. 2.

Figure 3:
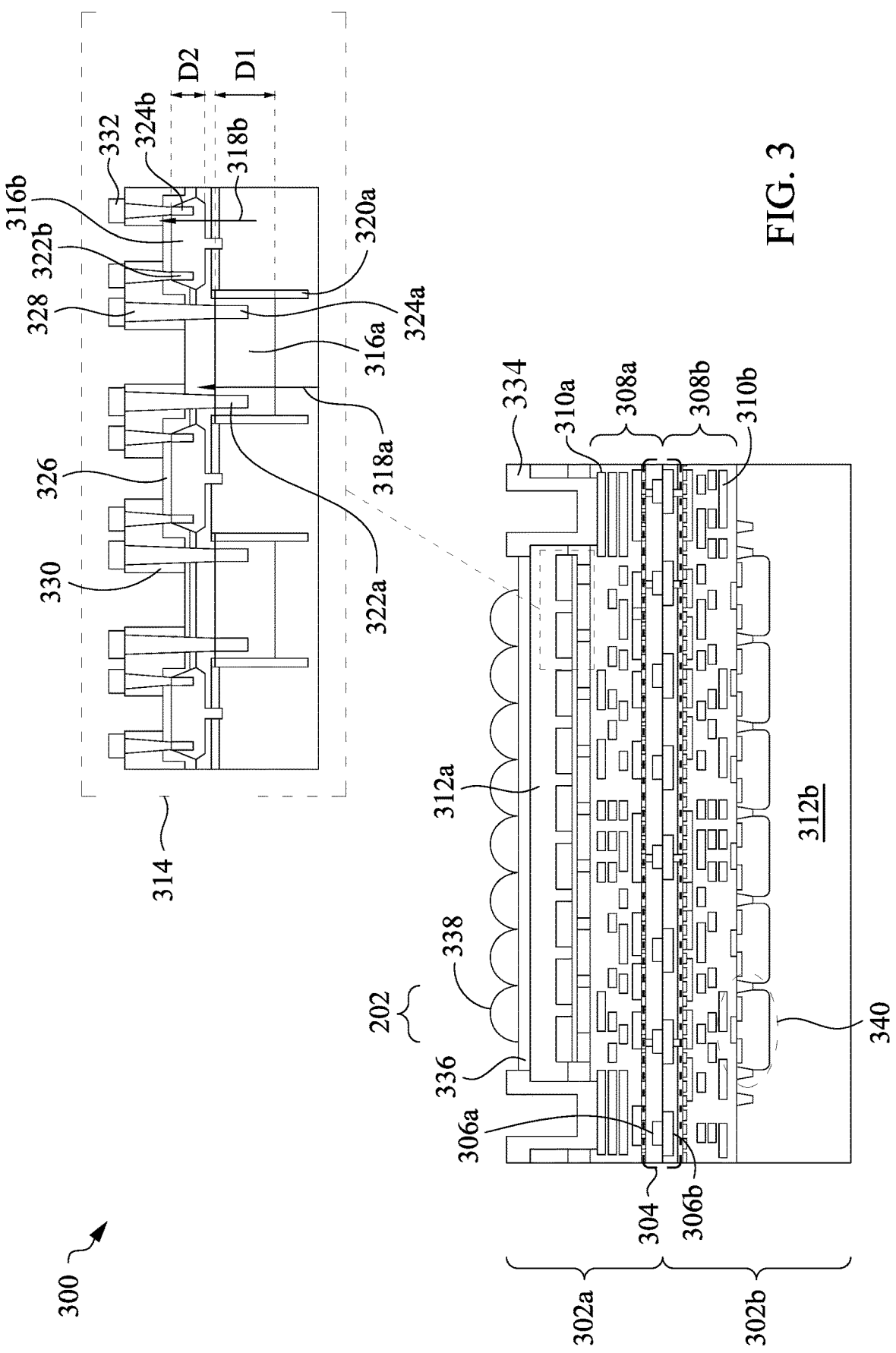
FIG. 3 is diagram of an example semiconductor die package described herein.

FIG. 3 is a diagram of an example optoelectronic device 300 described herein. In some implementations, the optoelectronic device 300 corresponds to a three dimensional complementary metal oxide semiconductor image sensor (3D CIS) device, in which the semiconductor devices 302a and 302b are stacked and/or vertically arranged. As shown in FIG. 3, the semiconductor device 302a (e.g., a photonic semiconductor die) and the semiconductor device 302b (e.g., a complementary metal-oxide semiconductor (CMOS) die) are joined by a bonding interface 304. The bonding interface 304 may include contacts 306a and 306b that are joined through a eutectic bond. The contacts 306a and 306b may include an alloy as an aluminum-copper alloy (Al—Cu), an aluminum-germanium alloy (Al—Ge), or a copper tin alloy (Cu—Sn) material, among other examples.

As further shown in FIG. 3, the semiconductor device 302a may include a dielectric region 308a. The dielectric region 308a (e.g., an intermetal dielectric region) may include one or more layers of dielectric material (e.g., an iron oxide material ($Fe_xO_y$), a zinc oxide material (ZnO), a silicon oxide material ($SiO_x$), a silicon nitride material ($Si_xN_y$), a silicon oxynitride material (SiON), a tetraethyl orthosilicate oxide material, a phosphosilicate glass (PSG) material, a borophosphosilicate glass (BPSG) material, a fluorinated silica glass material (FSG), a carbon doped silicon oxide material, or another dielectric material). One or more metallization layers 310a may be formed in and/or in between the layers of the dielectric region 308a. The metallization layers 310a may include bonding pads, conductive lines, and/or other types of conductive structures that electrically connect the various regions of the semiconductor device 302a and/or electrically connect the various regions of the optoelectronic device 300 to one or more external devices and/or external packaging. In some implementations, the metallization layers 310a may be referred to as a BEOL metallization stack, and may include a conductive material, such as gold, copper, silver, cobalt, tungsten, a metal alloy, or a combination thereof, among other examples.

The semiconductor device 302a may further include a substrate 312a. In some implementations, the substrate 312a includes a semiconductor material such as a silicon material (Si) or a gallium arsenide (GaAs) material, among other examples. In some implementations, the substrate 312a includes a dielectric material such as an oxide material, among other examples. Additionally, or alternatively and in some implementations, the substrate 312a conforms to a silicon-on-insulator structure (e.g., and SOI structure).

As shown in the detailed view of FIG. 3, the semiconductor device 302a includes a multi-layer photodiode structure 314. The multi-layer photodiode structure 314, which may be included as part of the pixel sensor 202, includes multiple sensing structures, including sensing structure 316a (e.g., a lower sensing structure) and sensing structure 316b (e.g., a sensing structure above the sensing structure 316a). The sensing structures 316a and 316b may each be formed from a layer of a quantum effect material such as a germanium material (Ge), a silicon germanium material (SiGe), a type III material, a type V material, or another suitable quantum effect material. In some implementations, the sensing structures 316a and 316b include a same quantum effect material. In some implementations, the sensing structures 316a and 316b include different, respective quantum effect materials.

As described in greater detail in connection with FIGS. 5A-5M, the quantum effect materials of 316a and/or 316b may be formed using a selective epitaxial growth process after forming cavities and/or recesses in the substrate 312a (and/or other layers of the multi-layer photodiode structure 314) using photolithography and etching processes. However, other formation techniques may be used (e.g., formation through direct epitaxial growth processes, formation after surface treatment of the substrate 312a and/or other layers of the multi-layer photodiode structure 314a).

As shown in the detailed view of FIG. 3, electromagnetic waves 318a and 318b (e.g., light waves) are shown as passing through the multi-layer photodiode structure 314. The electromagnetic wave 318a is passing through the sensing structure 316a. Within the multi-layer photodiode structure 314, a quantum length for the electromagnetic wave 318a corresponds to a thickness D1 of the sensing structure 316a.

Additionally, the electromagnetic wave 318b is passing through the sensing structure 316b. Within the multi-layer photodiode structure 314, a quantum length for the electromagnetic wave 318b corresponds to the thickness D2 of the sensing structure 316b. As such, an effective quantum length of the multi-layer photodiode structure 314 for the electromagnetic waves 318a and 318b (e.g., D1+D2) is increased relative to another photodiode structure including another sensing structure formed from a single layer of a quantum material.

In this way, a performance (e.g., a sensitivity) of the optoelectronic device 300 including the multi-layer photodiode structure 314 is increased relative to another optoelectronic device including a photodiode structure including a sensing structure formed from a single layer of a quantum effect material. By improving the performance of the optoelectronic device 300, a quality and a reliability of the optoelectronic device 300 for a target application and/or environment may increase to improve a manufacturing yield and reduce a rate of field failures. Improving the manufacturing yield and reducing the rate of field failures may reduce an amount of resources (e.g., raw materials, semiconductor manufacturing tools, labor, and/or computing resources) needed to support a market consuming the optoelectronic device 300.

A range of thicknesses for the sensing structure 316a and the sensing structure 316b may be similar. For example, and in some implementations, the thickness D1 and the thickness D2 are each included in a range of approximately 2 microns to approximately 10 microns.

In some implementations, the thickness D2 is lesser relative to the thickness D1. Additionally, or alternatively, a ratio of D2:D1 may be included in a range of approximately 1:2 to approximately 1:1. If the ratio D2:D1 is included in the range of approximately 1:2 to approximately 1:1, an effective quantum length of multi-layer photodiode structure 314 may be sufficiently extended to satisfy a quantum effect performance threshold (e.g., a sensitivity threshold for the optoelectronic device 300). Additionally, or alternatively and if the ratio D2:D1 is within the range of approximately 1:2 to approximately 1:1, a size of the multi-layer photodiode structure 314 may be such that the multi-layer photodiode structure 314 is spatially compatible with other integrated circuitry included in the optoelectronic device 300. Additionally, or alternatively and if the ratio D2:D1 is within the range of approximately 1:2 to approximately 1:1, a cost of the optoelectronic device 300 may be viable. If D2:D1 is less than approximately 1:2, the effective quantum length of the multi-layer photodiode structure 314 may not be sufficiently extended to satisfy the quantum effect performance threshold. If the ratio D2:D1 is greater than approximately 1:1, a cost and/or efficiency of manufacturing the optoelectronic device 300 may increase. Additionally, or alternatively, and if the ratio D2:D1 is greater than approximately 1:1, a size of the multi-layer photodiode structure 314 may be such that the multi-layer photodiode structure 314 is spatially incompatible with other integrated circuitry included in the optoelectronic device 300. However, other values and ranges for the thicknesses D1 and D2, and the ratio D2:D1, are within the scope of the present disclosure.

The semiconductor device 302a may include additional features such as fixed lenses or modulated lenses that focus and/or distribute electromagnetic waves (e.g., the electromagnetic waves 318a, 318b, and/or other similar electromagnetic waves) amongst the sensing structures (e.g., the sensing structures 316a, 316b and/or other similar sensing structures) to tune or enhance a performance of the multi-layer photodiode structure 314. Focusing and/or distributing the electromagnetic waves may include focusing and/or distributing the electromagnetic waves to pass through centers of sensing structures or edges of sensing structures, among other examples.

In the detailed view of FIG. 3, and as described in more detail in connection with FIGS. 5E and 5J, dopants may be implanted into the multi-layer photodiode structure 314 to form one or more doped isolation regions 320a. As shown, the doped isolation regions 320a are adjacent to sidewalls of the sensing structure 316a and extend into the substrate 312a to a depth that is greater relative to a thickness D1 of the sensing structure 316a. In some implementations, the doped isolation regions 320a may merge with the sidewalls of the sensing structure 316a.

Furthermore, and as shown in the detailed view of FIG. 3, the sensing structures 316a includes regions to form a p-n junction or a p-i-n junction (e.g., a junction between a p-type region 322a, an intrinsic (or undoped) type region, and an n-type region 324a). For example, and as described in more detail in connection with FIGS. 5F and 5G, the sensing structure 316a may be doped with a p-type dopant to form the p-type region 322a and an n-type dopant to form the n-type region 324a. Additionally, or alternatively, and as described in greater detail in connection with FIGS. 5K and 5L, the sensing structure 316b may be doped with a p-type dopant to form a p-type region 322b and an n-type dopant to form an n-type region 324b.

The doped isolation regions 320a may reduce a likelihood of a leakage of an electrical current between integrated circuitry that may be included in the semiconductor device 302a and the sensing structure 316a (e.g., the p-n or p-i-n junctions of the sensing structure 316a). In this way, a performance of the sensing structure 316a (and the multi-layer photodiode structure 314) may be increased relative to another semiconductor device including a similar sensing structure that is not electrically isolated.

Furthermore, electrically isolating the sensing structure 316a enables using a common substrate (e.g., the substrate 312a) to form the sensing structure 316a and additional integrated circuitry. In this way, an amount resources (e.g., raw materials, semiconductor manufacturing tools, labor, and/or computing resources) needed to fabricate the optoelectronic device 300 may be reduced relative to using separate substrates for the sensing structure 316a and the additional integrated circuitry.

As further shown in the detailed view of FIG. 3, the multi-layer photodiode structure 314 may include additional structures and/or layers. For example, the multi-layer photodiode structure 314 may include a layer of a reflowed poly-silicon oxide (RPO) material 326 for insulative purposes. Additionally, or alternatively, the multi-layer photodiode structure 314 may include one or more interconnect structures 328, such as one or more vertical interconnects formed from a conductive material such as cobalt (Co), among other examples. Additionally, or alternatively, the multi-layer photodiode structure 314 may include an etch stop layer 330 that includes a silicon nitride material (SiN), among other examples.

In some implementations, the multi-layer photodiode structure 314 may connect with one or more metallization layers 332 that are above the multi-layer photodiode structure 314. The metallization layer(s) 332 may include a conductive material, such as gold, copper, silver, cobalt, tungsten, a metal alloy, or a combination thereof, among other examples.

As shown in FIG. 3, the semiconductor device 302a includes a bonding pad 334. The bonding pad 334 may contact one or more metallization layers 310a in the dielectric region 308a. The bonding pad 334 may include a conductive material, such as gold, silver, aluminum, copper, aluminum-copper, titanium, tantalum, titanium nitride, tantalum nitride, tungsten, a metal alloy, other metals, or a combination thereof. The bonding pad 334 may provide electrical connections between the metallization layers 310a of the optoelectronic device 300 and external devices and/or external packaging.

In some implementations, and shown in FIG. 3, the semiconductor device 302a includes a dielectric layer 336 above the multi-layer photodiode structure 314. In some implementations, the dielectric layer 336 includes a material such as a titanium nitride material (TiN) or an oxide such as a silicon dioxide ($SiO_2$) material. In some implementations, portions of the dielectric layer 336 are included as part of a color filter array (CFA) structure. Additionally, or alternatively, and in some implementations, portions of the dielectric layer 336 are included as part of a hard mask (HM) structure.

As further shown in FIG. 3, a micro-lens layer 338 is included above and/or on the dielectric layer 336. The micro-lens layer 338 may include a plurality of micro-lenses. In particular, the micro-lens layer 338 may include a respective micro-lens for pixel sensors in a pixel sensor array (e.g., each of the pixel sensors 202 included in the pixel array 200).

As further shown in FIG. 3, the semiconductor device 302b may include a dielectric region 308b. The dielectric region 308b (e.g., an intermetal dielectric region) may include one or more layers of dielectric material (e.g., a silicon oxide ($SiO_x$), a silicon nitride ($Si_xN_y$), a silicon oxynitride (SiON), tetraethyl orthosilicate oxide, phosphosilicate glass (PSG), borophosphosilicate glass (BPSG), fluorinated silica glass (FSG), carbon doped silicon oxide, or another dielectric material). One or more metallization layers 310b may be formed in and/or in between the layers of the dielectric region 308b. The metallization layers 310b may include bonding pads, conductive lines, and/or other types of conductive structures that electrically connect the various regions of the semiconductor device 302b and/or electrically connect the various regions of the optoelectronic device 300 to one or more external devices and/or external packaging. In some implementations, the metallization layers 310b may be referred to as a BEOL metallization stack, and may include a conductive material, such as gold, copper, silver, cobalt, tungsten, a metal alloy, or a combination thereof, among other examples.

The semiconductor device 302b may further include a substrate 312b. In some implementations, the substrate 312b includes a semiconductor material such as a silicon material (Si) or a gallium arsenide material (GaAs), among other examples. As further shown in FIG. 3, the semiconductor device 302b includes logic integrated circuitry 340 in or on the substrate 312b. In some implementations, the logic integrated circuitry 340 is electrically connected to the multi-layer photodiode structure 314 through the bonding interface 304 (e.g., through the contacts 306a and 306b).

As shown in FIG. 3, a device (e.g., the optoelectronic device 300) includes a first semiconductor die (e.g., the semiconductor device 302a) that includes a first substrate (e.g., the substrate 312a) and a pixel sensor (e.g., the pixel sensor 202) that includes a multi-layer photodiode structure (e.g., multi-layer photodiode structure 314). The multi-layer photodiode structure includes a first sensing structure (e.g., the sensing structure 316a) that extends into the first substrate, includes a first quantum effect material, and has sidewalls that are adjacent to doped isolation regions (e.g., the doped isolation regions 320a) within the first substrate. The multi-layer photodiode structure includes a second sensing structure (e.g., the sensing structure 316b) that is above the first sensing structure and includes a second quantum effect material. The device includes a second semiconductor die joined (e.g., the semiconductor device 302b) with the first semiconductor die below the first semiconductor die. The second semiconductor die includes a second substrate (e.g., the substrate 312b) and logic integrated circuitry (e.g., the logic integrated circuitry 340) on or within the second substrate.

Although the optoelectronic device 300 of FIG. 3 corresponds to a stacked device (e.g., the semiconductor device 302a stacked on the semiconductor device 302b), structures and/or features described in connection with FIG. 3 may be included in other types of optoelectronic devices (frontside illumination sensor (FSI) devices or backside illumination sensor (BSI) devices, among other examples).

As indicated above, FIG. 3 is provided as an example. Other examples may differ from what is described with regard to FIG. 3.

Figure 4A:
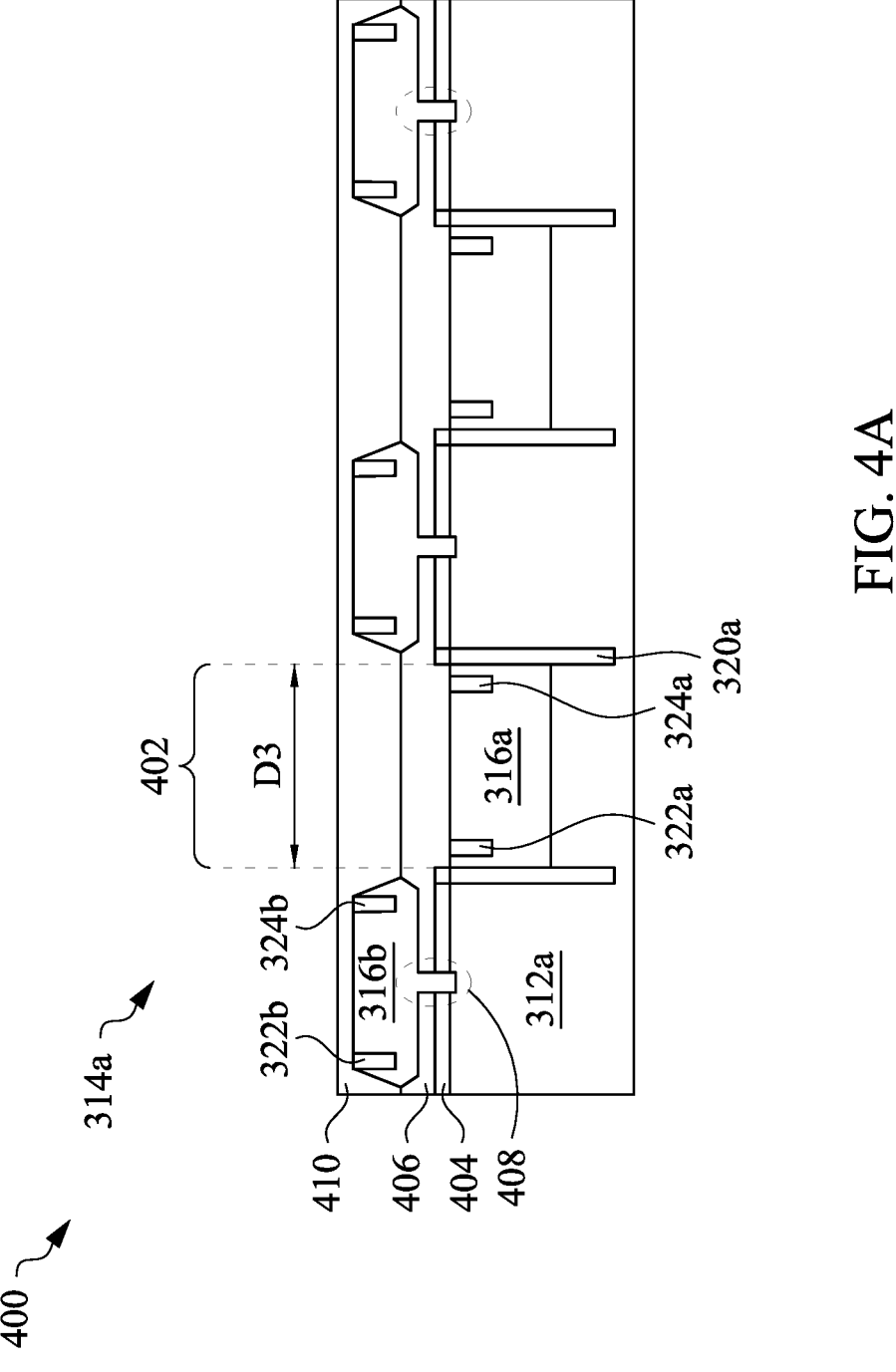
FIG. 4A-4C are diagrams of example implementations of a multi-layer photodiode structure described herein.
Figure 4B:
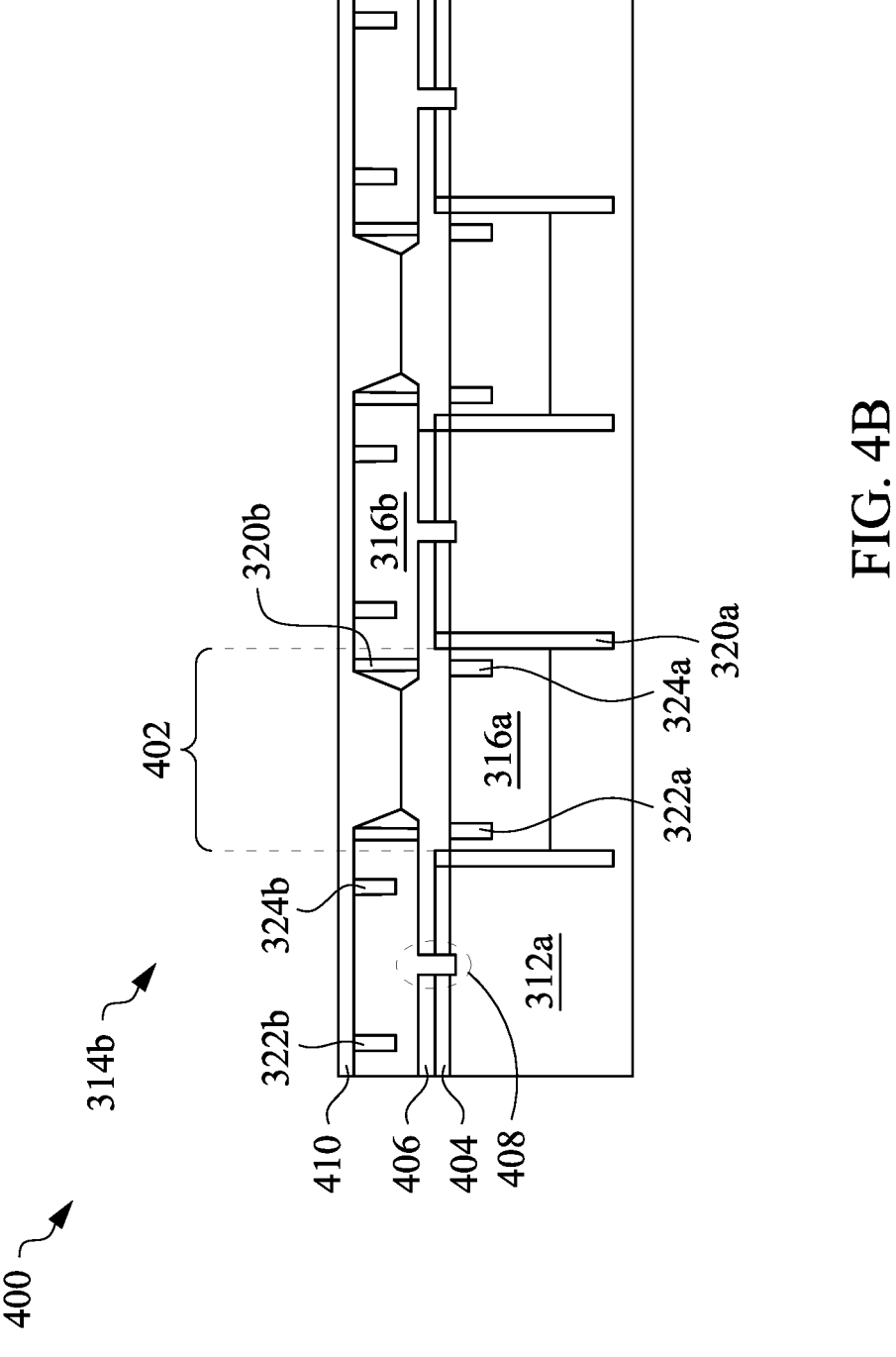
Figure 4C:
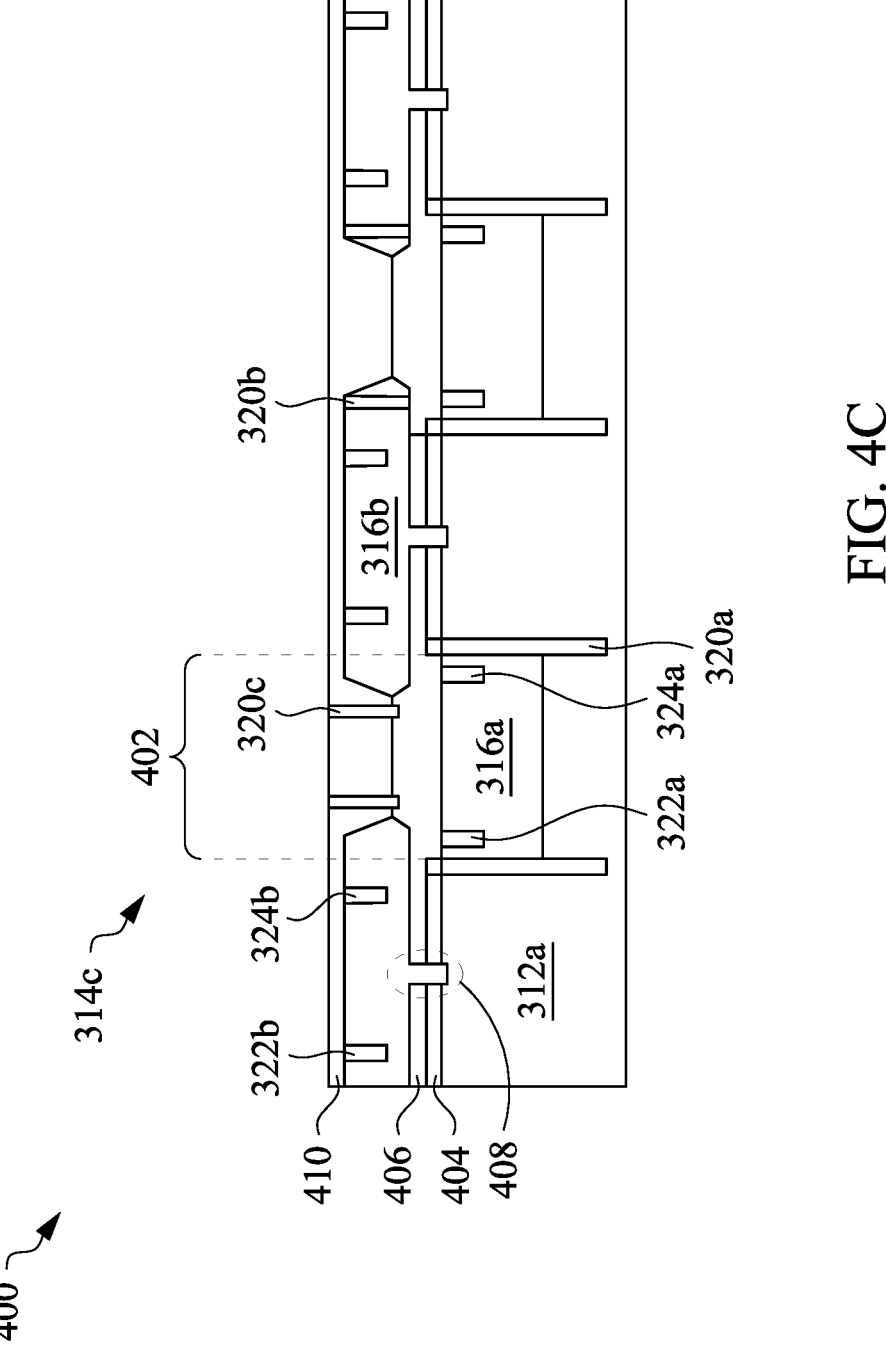

FIG. 4A-4C are diagrams of example implementations 400 of a multi-layer photodiode structure described herein. The multi-layer photodiode structure may correspond to the multi-layer photodiode structure 314 described in connection with FIG. 3 and elsewhere herein. FIGS. 4A-4C show different configurations of the multi-layer photodiode structure 314 in relation to an electromagnetic wave transmissive region 402 (e.g., an electromagnetic transmissive region for the electromagnetic waves 318a and 318b) that includes the sensing structure 316a and has a same approximate width as the sensing structure 316a.

In the multi-layer photodiode structure 314a of FIG. 4A, the electromagnetic wave transmissive region 402 includes the sensing structure 316a (e.g., a first sensing structure). Furthermore, and as shown in FIG. 4A, the sensing structure 316b (e.g., a second sensing structure) that is over the sensing structure 316a is contained outside the electromagnetic wave transmissive region 402.

As further shown in FIG. 4A, the electromagnetic wave transmissive region 402 and the sensing structure 316a have the same approximate width D3. As an example, the width D3 may be included in a range of approximately 1 micron to approximately 10 microns. If the width D3 is within the range of approximately 1 micron to approximately 10 microns, the electromagnetic wave transmissive region 402 may provide a sufficient width to detect electromagnetic waves (e.g., the electromagnetic waves 318a and 318b) to improve a performance of the multi-layer photodiode structure 314a. Additionally, or alternatively and if the width D3 is within the range of approximately 1 micron to approximately 10 microns, a size of the multi-layer photodiode structure 314 may maintain a size (and cost) of an optoelectronic device including multi-layer photodiode structure 314 (e.g., the optoelectronic device 300 within a viable range. If the width D3 is less than approximately 1 micron, the sensing structure 316a and/or the electromagnetic wave transmissive region 402 may span an area that is insufficient to detect electromagnetic waves (e.g., the electromagnetic waves 318a and 318b) and as a result decrease a performance of the multi-layer photodiode structure 314a. If the width D3 is greater than approximately 10 microns, a size (and a cost) of an optoelectronic device including the multi-layer photodiode structure 314a (e.g., the optoelectronic device 300) may increase. However, other values and ranges for the width D3 are included within the scope of the present disclosure.

As shown in FIG. 4A, the sensing structure 316a extends into the substrate 312a and the doped isolation regions 320a (e.g., first doped isolation regions) are adjacent to sidewalls of the sensing structure 316a. In some implementations, the doped isolation regions 320a may merge with the sidewalls of the sensing structure 316a and/or contact the sidewalls of the sensing structure 316a. The p-type region 322a (e.g., a first p-type region) and the n-type region 324a (e.g., a first n-type region) may form a junction (e.g., a p-n or p-i-n junction) within the sensing structure 316a.

The multi-layer photodiode structure 314a includes a layer of an oxide material 404 that is below the sensing structure 316b and above the sensing structure 316a. The layer of the oxide material 404 may include a silicon dioxide material (SiO2), among other examples.

Furthermore, the multi-layer photodiode structure 314a includes a layer of a dielectric material 406 (e.g., a first layer of a dielectric material) over the layer of the oxide material 404. The layer of the dielectric material 406 may include a silicon nitride material (SiN), among other examples.

As further shown in FIG. 4A, the sensing structure 316b includes a bottom-side protrusion 408 that extends downwards through the layer of the dielectric material 406, through the layer of the oxide material 404, and to the substrate 312a. As described in greater detail in connection with FIGS. 5I and 5J, the bottom-side protrusion 408 may be formed during an epitaxial growth operation that initiates formation of the sensing structure 316b within a cavity that passes through the layer of the dielectric material 406 and through the layer of the oxide material 404. The p-type region 322b (a second p-type region) and the n-type region 324b (e.g., a second n-type region) may form a junction (e.g., a p-n or p-i-n junction) within the sensing structure 316b.

As shown in the multi-layer photodiode structure 314b of FIG. 4B (a second example implementation), and in contrast to the multi-layer photodiode structure 314a of FIG. 4A, the sensing structure 316b extends laterally into the electromagnetic wave transmissive region 402 and includes doped isolation regions 320b (e.g., second doped isolation regions). In some implementations, and as shown in FIG. 4B, the doped isolation regions 320b are within the electromagnetic wave transmissive region 402.

The multi-layer photodiode structure 314b may satisfy a performance range (e.g., a range bounded by lower and upper sensitivity thresholds) that is different than another performance range associated with the multi-layer photodiode structure 314a. Additionally, or alternatively, an effective quantum length of the multi-layer photodiode structure 314b may be different than an effective quantum length associated with the multi-layer photodiode structure 314a. Additionally, or alternatively, an electrical isolation characteristic (e.g., a leakage performance) of the multi-layer photodiode structure 314b may be different than an electrical isolation characteristic of the multi-layer photodiode structure 314a.

As shown in the multi-layer photodiode structure 314c of FIG. 4C (a third example implementation), and in contrast to the multi-layer photodiode structure 314a of FIG. 4A and the multi-layer photodiode structure 314b of FIG. 4B, a layer of an epitaxial material 410 is included as part of the multi-layer photodiode structure 314c. The layer of an epitaxial material 410 (e.g., a layer of a silicon material (Si), among other examples) may include additional integrated circuitry. In some implementations the layer of the epitaxial material 410 includes doped isolation regions 320c (e.g., third isolation regions).

Furthermore, and as shown in FIG. 4C, the doped isolation regions 320c may be intermittently dispersed amongst one or more of the sensing structure(s) 316b. An electrical isolation characteristic of the multi-layer photodiode structure 314c may be different than an isolation characteristic of the multi-layer photodiode structure 314a and/or 314b. Furthermore, the isolation characteristic of the multi-layer photodiode structure 314c may be tuned based on an arrangement or location of the doped isolation regions 320a, 320b, and/or 320c.

In some implementations, a concentration of a dopant in the doped isolation region 320a, 320b, and/or 320c may vary vertically. Additionally, or alternatively, a concentration of the dopant in the doped isolation region 320a, 320b, and/or 320c may vary within a device (e.g., the optoelectronic device 300) based on a design of a pixel sensor that may be associated with the multi-layer photodiode structure 314 (e.g., the pixel sensor 202a, the pixel sensor 202b, the pixel sensor 202c, or the pixel sensor 202d that may be associated with multi-layer photodiode structure 314).

As described in connection with FIGS. 3 and 4A-4C, and in some implementations, an optoelectronic device (e.g., the optoelectronic device 300) includes a substrate (e.g., the substrate 312a). The optoelectronic device includes a multi-layer photodiode structure (e.g., the multi-layer photodiode structure 314) that includes a first sensing structure (e.g., the sensing structure 316a). The first sensing structure extends into the substrate, includes a first quantum effect material, and has sidewalls that are adjacent to doped isolation regions (e.g., the doped isolation regions 320a) within the substrate. The multi-layer photodiode structure includes a second sensing structure (e.g., the sensing structure 316b) that is above the first sensing structure and includes a second quantum effect material. The multi-layer photodiode structure includes a layer of an oxide material (e.g., the layer of the oxide material 404) that is below the second sensing structure and that is above the first sensing structure. The multi-layer photodiode structure includes a layer of a dielectric material (e.g., the layer of the dielectric material 406) that is above the layer of the oxide material and that is below the second sensing structure.

As indicated above, FIGS. 4A-4C are provided as examples. Other examples may differ from what is described with regard to FIGS. 4A-4C.

FIGS. 5A-5M are diagrams of an example implementation 500 described herein. The implementation 500 may include a series of one or more semiconductor processing operations performed by the one or more semiconductor processing tools 102-116 and/or the wafer/die transport tool 118 of FIG. 1.

Figure 5B:
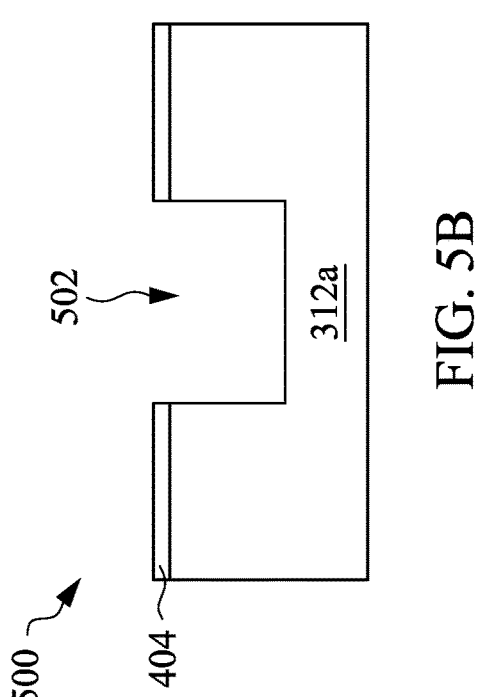
FIGS. 5A-5M are diagrams of an example implementation described herein.
Figure 5C:
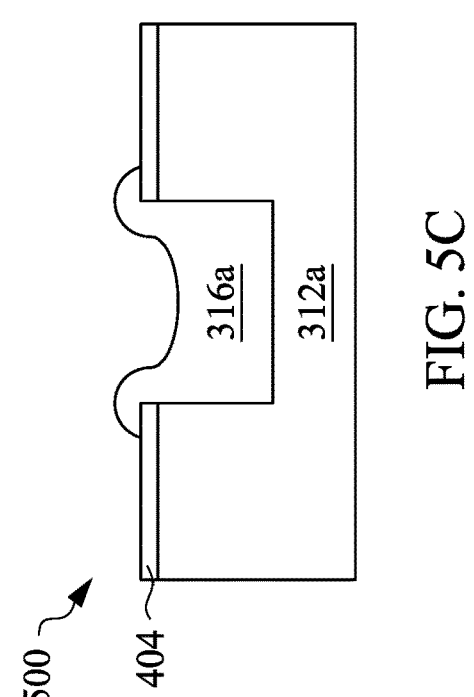
Figure 5A:
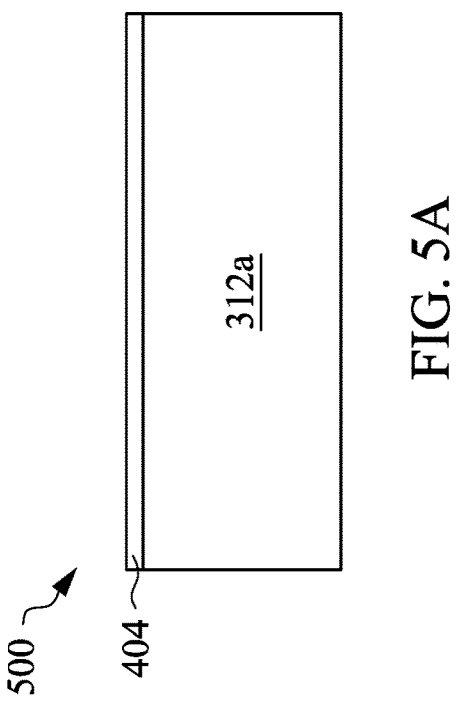

As shown in FIG. 5A, the layer of the oxide material 404 is formed over and/or on the substrate 312a. The deposition tool 102 may be used to deposit the layer of the oxide material 404 (or another suitable dielectric material) in a PVD operation, an ALD operation, a CVD operation, an epitaxy operation, an oxidation operation, another type of deposition operation described in connection with FIG. 1, and/or another suitable deposition operation. In some implementations, the planarization tool 110 may be used to planarize the layer of the oxide material 404 after the layer of the oxide material is deposited.

As an example, and in some implementations, the layer of the oxide material 404 has a thickness of up to approximately 1 micron. However, other values and ranges for the thickness are within the scope of the present disclosure.

As shown in FIG. 5B, a cavity 502 is formed through the layer of the oxide material 404 and into the substrate 312a.

In some implementations, a pattern in a photoresist layer is used to etch the layer of the oxide material 404 and the substrate 312a to form the cavity 502. In these implementations, the deposition tool 102 may be used to form the photoresist layer on the layer of the oxide material 404. The exposure tool 104 may be used to expose the photoresist layer to a radiation source to pattern the photoresist layer. The developer tool 106 may be used to develop and remove portions of the photoresist layer to expose the pattern. The etch tool 108 may be used to etch the layer of the oxide material 404 and the substrate 312a based on the pattern to form the cavity 502. In some implementations, the etch operation includes a plasma etch operation, a wet chemical etch operation, and/or another type of etch operation. In some implementations, a photoresist removal tool may be used to remove the remaining portions of the photoresist layer (e.g., using a chemical stripper, plasma ashing, and/or another technique). In some implementations, a hard mask layer is used as an alternative technique for etching the layer of the oxide material 404 and the substrate 312a based on a pattern.

As an example, and in some implementations, the cavity 502 has width of up to approximately 10 microns and a depth of up to approximately 10 microns. However, other values and ranges for the width and depth are within the scope of the present disclosure.

As shown in FIG. 5C, the sensing structure 316a is formed over and/or on the substrate 312a (e.g., within cavity 502). The deposition tool 102 may be used to deposit a quantum effect material to form the sensing structure 316a in an epitaxy operation, another type of deposition operation described in connection with FIG. 1, and/or another suitable deposition operation.

Figures 5D, 5E:
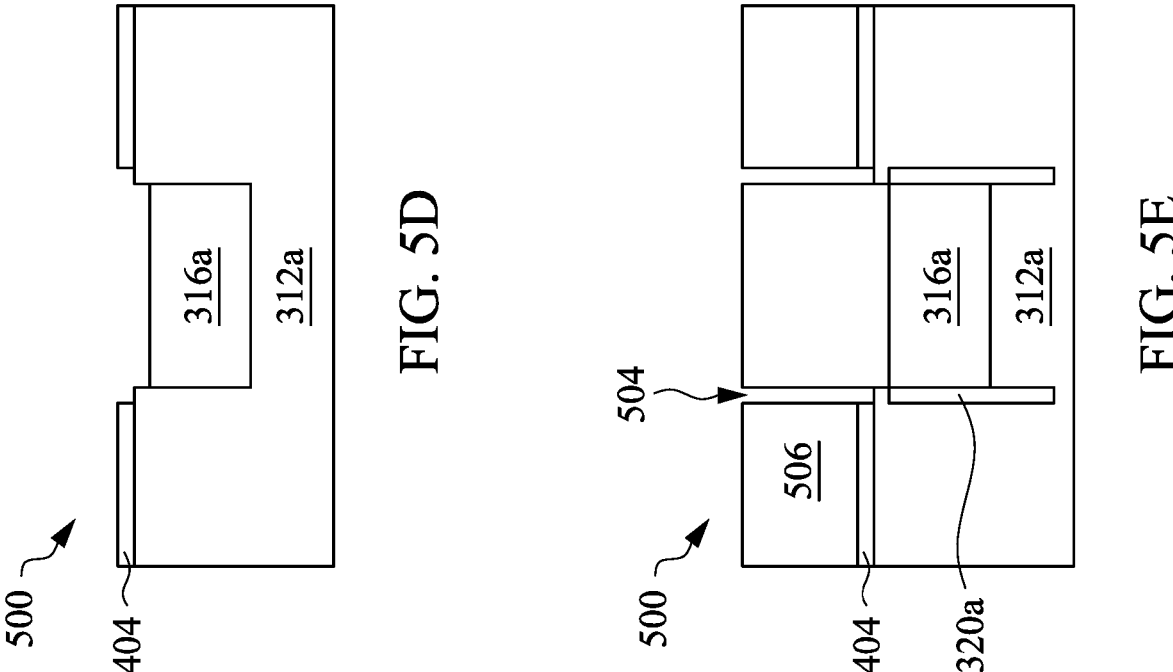

A shown in FIG. 5D, the sensing structure 316a is planarized. The planarization tool 110 may be used to planarize the sensing structure 316a using a CMP operation, another type of planarization operation described in connection with FIG. 1, and/or another planarization operation. In some implementations, planarizing the sensing structure 316a includes removing a portion of the oxide layer 404.

As shown in FIG. 5E, the doped isolation regions 320a are formed in the substrate 312a. In some implementations, a pattern of cavities 504 in a photoresist layer 506 is used to define the doped isolation regions 320a. In these implementations, the deposition tool 102 may be used to form the photoresist layer 506 on the layer of the oxide material 404. The exposure tool 104 may be used to expose the photoresist layer 506 to a radiation source to pattern the photoresist layer 506. The developer tool 106 may be used to develop and remove portions of the photoresist layer 506 to form the pattern of cavities 504. After formation of the pattern of cavities 504, the ion implantation tool 114 may be used to implant ions (boron (B) ions, among other examples) into the substrate 312a to dope the substrate 312a and form the doped isolation regions 320a. In some implementations, a photoresist removal tool may be used to remove the remaining portions of the photoresist layer 506 (e.g., using a chemical stripper, plasma ashing, and/or another technique).

Figure 5F:
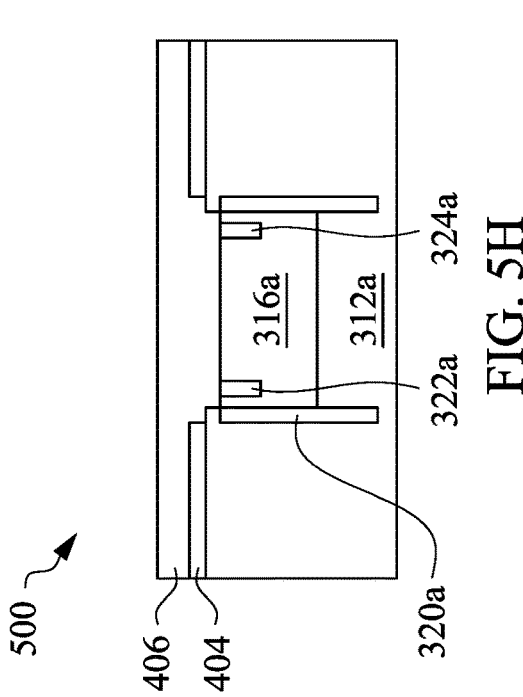

As shown in FIG. 5F, the p-type regions 322a are formed in the sensing structure 316a. In some implementations, a pattern of cavities 508 in a photoresist layer 510 is used to define the p-type regions 322a. In these implementations, the deposition tool 102 may be used to form the photoresist layer 510 on the layer of the oxide material 404 and the sensing structure 316a. The exposure tool 104 may be used to expose the photoresist layer 510 to a radiation source to pattern the photoresist layer 510. The developer tool 106 may be used to develop and remove portions of the photoresist layer to 510 form the pattern of cavities 508. After formation of the pattern of cavities 508, the ion implantation tool 114 may be used to implant ions (gallium (Ga), aluminum (Al), or indium (In) ions, among other examples) into the sensing structure 316a to dope the sensing structure 316a and form the p-type regions 322a. In some implementations, a photoresist removal tool may be used to remove the remaining portions of the photoresist layer 510 (e.g., using a chemical stripper, plasma ashing, and/or another technique).

Figure 5H:
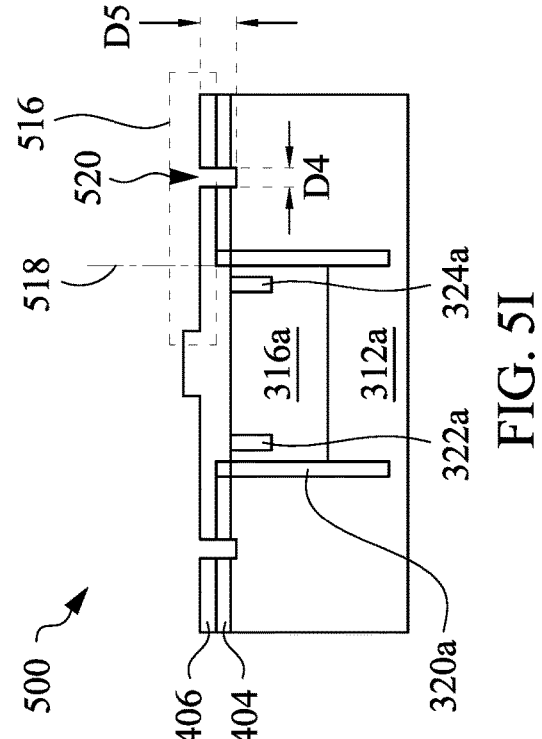
Figure 5G:
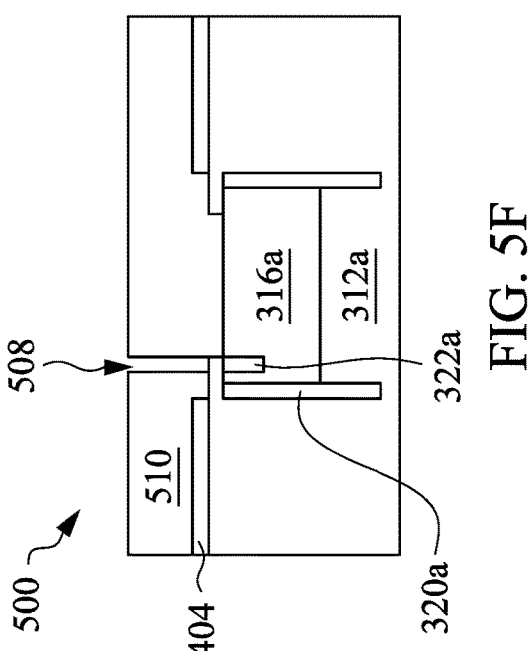

As shown in FIG. 5G, the n-type regions 324a are formed in the sensing structure 316a. In some implementations, a pattern of cavities 512 in a photoresist layer 514 is used to define the n-type regions 324a. In these implementations, the deposition tool 102 may be used to form the photoresist layer 514 on the layer of the oxide material 404 and the sensing structure 316a. The exposure tool 104 may be used to expose the photoresist layer 514 to a radiation source to pattern the photoresist layer 514. The developer tool 106 may be used to develop and remove portions of the photoresist layer 514 to form the pattern of cavities 512. After formation of the pattern of cavities 512, the ion implantation tool 114 may be used to implant ions (phosphorous (P), arsenic (As), or antimony (Sb) ions, among other examples) into the sensing structure 316a to dope the sensing structure 316a and form the n-type regions 324a. In some implementations, a photoresist removal tool may be used to remove the remaining portions of the photoresist layer 514 (e.g., using a chemical stripper, plasma ashing, and/or another technique).

As shown in FIG. 5H, the layer of the dielectric material 406 is formed over and/or on the layer of the oxide material 404. The deposition tool 102 may be used to deposit the layer of the dielectric material 406 in a PVD operation, an ALD operation, a CVD operation, an epitaxy operation, an oxidation operation, another type of deposition operation described in connection with FIG. 1, and/or another suitable deposition operation. In some implementations, the planarization tool 110 may be used to planarize the layer of the dielectric material 406 after the layer of the dielectric material 406 is deposited.

As an example, and in some implementations, the layer of the dielectric material 406 has a thickness of up to approximately 2 microns. However, other values and ranges for the thickness are within the scope of the present disclosure.

Figure 5I:
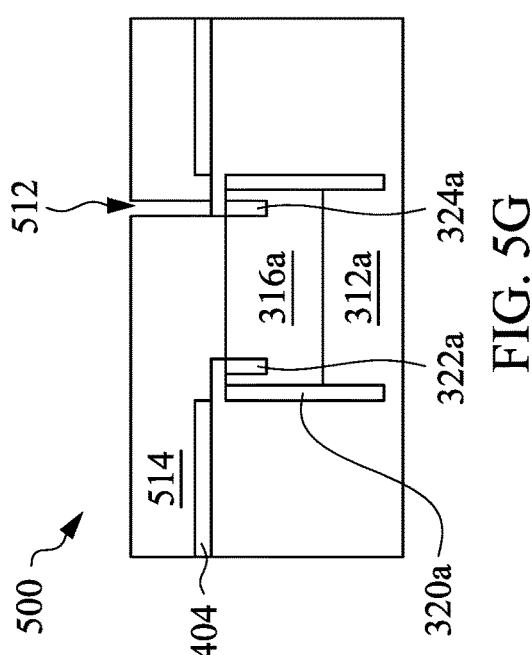

As shown in FIG. 5I, a recessed region 516 is formed in the layer of the dielectric material 406. In some implementations, a pattern in a photoresist layer is used to etch the layer of the dielectric material 406 to form the recessed region 516. In these implementations, the deposition tool 102 may be used to form the photoresist layer on the layer of the dielectric material 406. The exposure tool 104 may be used to expose the photoresist layer to a radiation source to pattern the photoresist layer. The developer tool 106 may be used to develop and remove portions of the photoresist layer to expose the pattern. The etch tool 108 may be used to etch the layer of the dielectric material 406 based on the pattern to form the recess in the layer of the dielectric material 406. In some implementations, the etch operation includes a plasma etch operation, a wet chemical etch operation, and/or another type of etch operation. In some implementations, a photoresist removal tool may be used to remove the remaining portions of the photoresist layer (e.g., using a chemical stripper, plasma ashing, and/or another technique). In some implementations, a hard mask layer is used as an alternative technique for etching the layer of the dielectric material 406 based on a pattern.

In some implementations (the multi-layer photodiode structure 314b of FIG. 4B, among other examples) and as shown in FIG. 5I, the recessed region 516 extends across a boundary 518 corresponding to an outer edge of the sensing structure 316a such that the recessed region 516 overlaps the sensing structure 316a. In some implementations (the multi-layer photodiode structure 314a of FIG. 4A, among other examples), the recessed region 516 is contained adjacent to the boundary 518 such that no portion of the recessed region 516 overlaps the sensing structure 316a.

As further shown in FIG. 5I, a cavity 520 is formed in the recessed region 516, through the layer of the dielectric material 406, and through the layer of the oxide material 404 to the substrate 312a. In some implementations, a pattern in a photoresist layer is used to etch the layer of the dielectric material 406 and the layer of the oxide material 404 to form the cavity 520. In these implementations, the deposition tool 102 may be used to form the photoresist layer on the layer of the dielectric material 406. The exposure tool 104 may be used to expose the photoresist layer to a radiation source to pattern the photoresist layer. The developer tool 106 may be used to develop and remove portions of the photoresist layer to expose the pattern. The etch tool 108 may be used to etch the layer of the dielectric material 406 and the layer of the oxide material 404 based on the pattern to form the cavity 520. In some implementations, the etch operation includes a plasma etch operation, a wet chemical etch operation, and/or another type of etch operation. In some implementations, a photoresist removal tool may be used to remove the remaining portions of the photoresist layer (e.g., using a chemical stripper, plasma ashing, and/or another technique). In some implementations, a hard mask layer is used as an alternative technique for etching the layer of the oxide the dielectric material 406 and the layer of the oxide material 404 based on a pattern.

In some implementations, the cavity 520 may be formed to have a width D4 that is included in a range of approximately 0.1 microns to approximately 1.0 micron. Additionally, or alternatively, the cavity 520 may be formed to have a depth D5 that is included in a range of approximately 0.1 microns to approximately 1.0 micron. If the width D4 and/or the depth D5 are within the range of approximately 0.1 microns to approximately 1.0 micron, a volume of the cavity 520 may be sufficient to initiate epitaxial growth of a quantum effect material for another sensing structure (e.g., the sensing structure 316b). Additionally, or alternatively, an aspect ratio of the cavity 520 may reduce defects (e.g., peeling, voids) within the quantum effect material. If the cavity 520 has a width D4 and/or a depth D5 of less than approximately 0.1 microns, a volume of the cavity 520 may be insufficient to initiate epitaxial growth of a quantum effect material for the other sensing structure. If the cavity 520 has a width D4 and/or a depth D5 of greater than approximately 1.0 micron, the aspect ratio of the cavity 520 may cause defects (e.g., peeling, voids) within the quantum effect material. However, other values and ranges for the width D4 and the depth D5 are within the scope of the present disclosure.

Figure 5L:
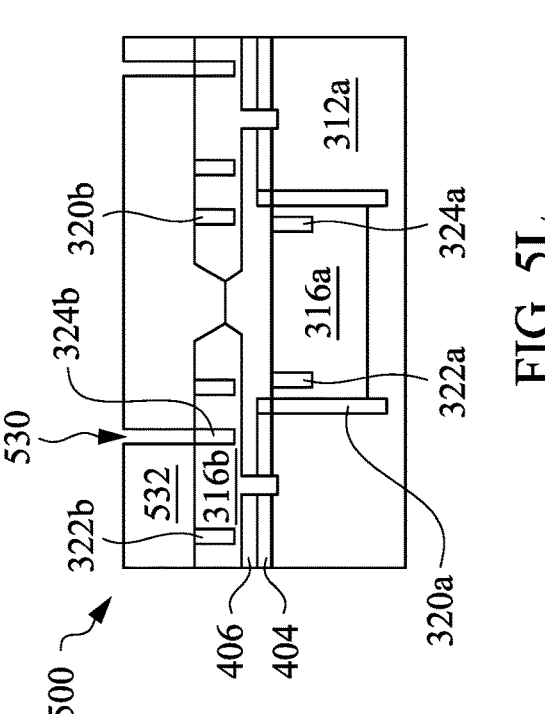
Figure 5M:
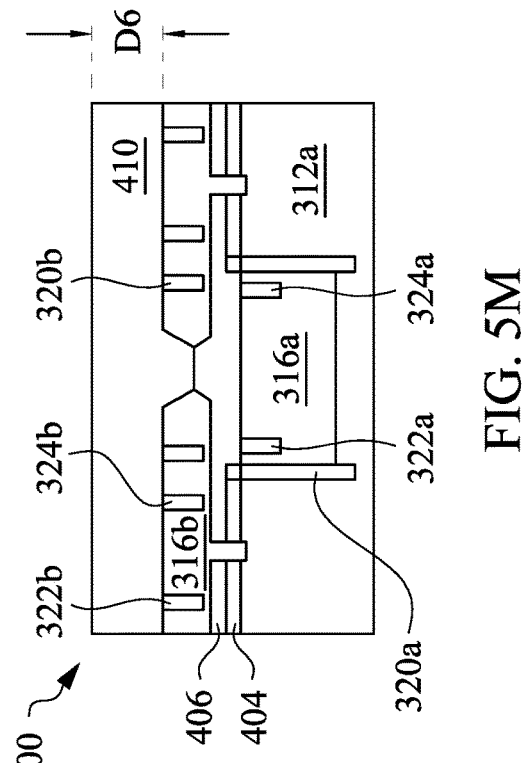
Figure 5J:
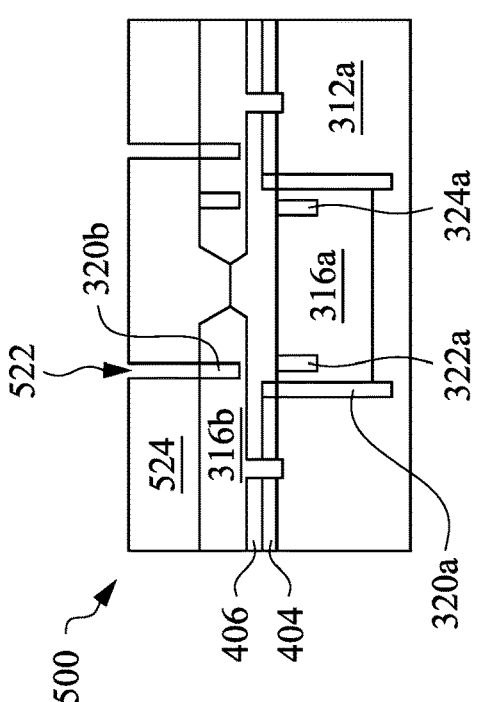

As shown in FIG. 5J, the sensing structure 316b is formed over and/or on the layer of the dielectric material 406 (e.g., within the recessed region 516). The deposition tool 102 may be used to deposit a quantum effect material to form the sensing structure 316b in an epitaxy operation, another type of deposition operation described in connection with FIG. 1, and/or another suitable deposition operation. As shown in FIG. 5J, forming the sensing structure 316*b* includes forming the bottom-side protrusion 408 (e.g., within the cavity 520). The bottom-side protrusion 408 may have similar dimensions to the cavity 520 (e.g., a width D4 and a depth D5).

In FIG. 5J, the sensing structure 316*b* may be planarized. The planarization tool 110 may be used to planarize the sensing structure 316*b* using a CMP operation, another type of planarization operation described in connection with FIG. 1, and/or another planarization operation.

Further, and as shown in FIG. 5J, the doped isolation regions 320*b* are formed in the sensing structure 316*b*. In some implementations, a pattern of cavities 522 in a photoresist layer 524 is used to define the doped isolation regions 320*b*. In these implementations, the deposition tool 102 may be used to form the photoresist layer 524 on the sensing structure 316*b* and/or over the layer of the dielectric material 406. The exposure tool 104 may be used to expose the photoresist layer 524 to a radiation source to pattern the photoresist layer 524. The developer tool 106 may be used to develop and remove portions of the photoresist layer 524 to form the pattern of cavities 522. After formation of the pattern of cavities 522, the ion implantation tool 114 may be used to implant ions (boron (B) ions, among other examples) into the sensing structure 316*b* to dope the sensing structure 316*b* and form the doped isolation regions 320*b*. In some implementations, a photoresist removal tool may be used to remove the remaining portions of the photoresist layer 524 (e.g., using a chemical stripper, plasma ashing, and/or another technique).

Figure 5K:
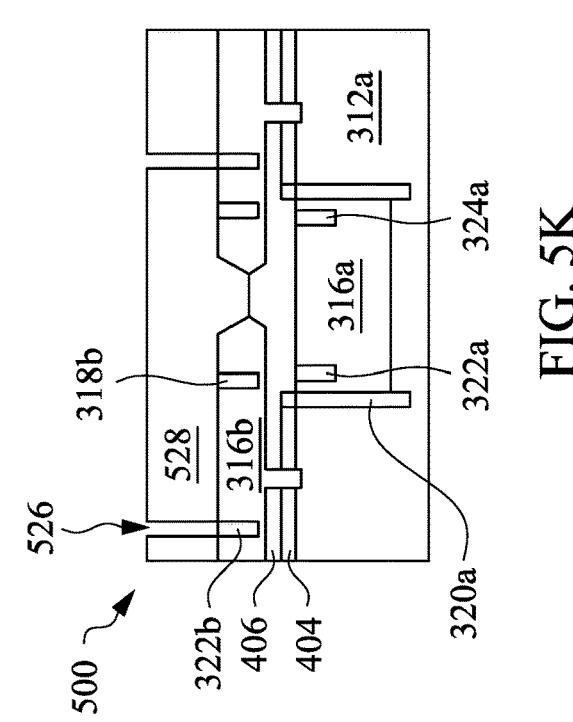

As shown in FIG. 5K, the p-type regions 322*b* are formed in the sensing structure 316*b*. In some implementations, a pattern of cavities 526 in a photoresist layer 528 is used to define the p-type regions 322*b*. In these implementations, the deposition tool 102 may be used to form the photoresist layer 528 on the layer of the oxide material 404 and the sensing structure 316*a*. The exposure tool 104 may be used to expose the photoresist layer 528 to a radiation source to pattern the photoresist layer 528. The developer tool 106 may be used to develop and remove portions of the photoresist layer 528 to form the pattern of cavities 526. After formation of the pattern of cavities 526, the ion implantation tool 114 may be used to implant ions (gallium (Ga), aluminum (Al), or indium (In) ions, among other examples) into the sensing structure 316*b* to dope the sensing structure 316*b* and form the p-type regions 322*b*. In some implementations, a photoresist removal tool may be used to remove the remaining portions of the photoresist layer 528 (e.g., using a chemical stripper, plasma ashing, and/or another technique).

As shown in FIG. 5L, the n-type regions 324*b* are formed in the sensing structure 316*b*. In some implementations, a pattern of cavities 530 in a photoresist layer 532 is used to define the n-type regions 324*b*. In these implementations, the deposition tool 102 may be used to form the photoresist layer 532 on the sensing structure 316*b* and/or over the layer of the dielectric material 406. The exposure tool 104 may be used to expose the photoresist layer 532 to a radiation source to pattern the photoresist layer 532. The developer tool 106 may be used to develop and remove portions of the photoresist layer 532 to form the pattern of cavities 530. After formation of the pattern of cavities 530, the ion implantation tool 114 may be used to implant ions (phosphorous (P), arsenic (As), or antimony (Sb) ions, among other examples) into the sensing structure 316*b* to dope the sensing structure 316*b* and form the n-type regions 324*b*. In some implementations, a photoresist removal tool may be used to remove the remaining portions of the photoresist layer 532 (e.g., using a chemical stripper, plasma ashing, and/or another technique).

As shown in FIG. 5M, the layer of epitaxial material 410 is formed on and/or over the sensing structure 316*b*. The deposition tool 102 may be used to deposit the layer of the epitaxial material 410 in an epitaxy operation, another type of deposition operation described in connection with FIG. 1, and/or another suitable deposition operation. In some implementations, the planarization tool 110 may be used to planarize the layer of the epitaxial material 410 after the layer of the epitaxial material 410 is deposited.

As an example, and in some implementations, the layer of the epitaxial material 410 has a thickness D6 that is included in a range of approximately 4 microns to approximately 6 microns. If the thickness D6 is included in the range of approximately 4 microns to approximately 6 microns, a risk of an electrical leakage within a semiconductor device including the layer of epitaxial material 410 (e.g., the semiconductor device 302*a*) may be reduced. Additionally, or alternatively and if the thickness D6 is included in the range of approximately 4 microns to approximately 6 microns, a cost of manufacturing the semiconductor device may be viable. If the thickness D6 is less than approximately 4 microns, the risk of leakage within a semiconductor device including the layer of epitaxial material 410 may increase. If the thickness D6 is greater than approximately 6 microns, a cost of manufacturing the semiconductor device may increase and not be viable. However, other values and ranges for the thickness D6 are within the scope of the present disclosure.

The implementation 500 of FIGS. 5A-5M is provided as an example. The implementation 500 may include additional semiconductor processing operations, fewer semiconductor processing operations, different semiconductor processing operations, or differently arranged semiconductor processing operations than those shown in FIGS. 5A-5M. Additionally, or alternatively, one or more of the semiconductor processing operations may be performed using techniques and/or semiconductor processing tools other than those described in connection with FIG. 1.

Figure 6:
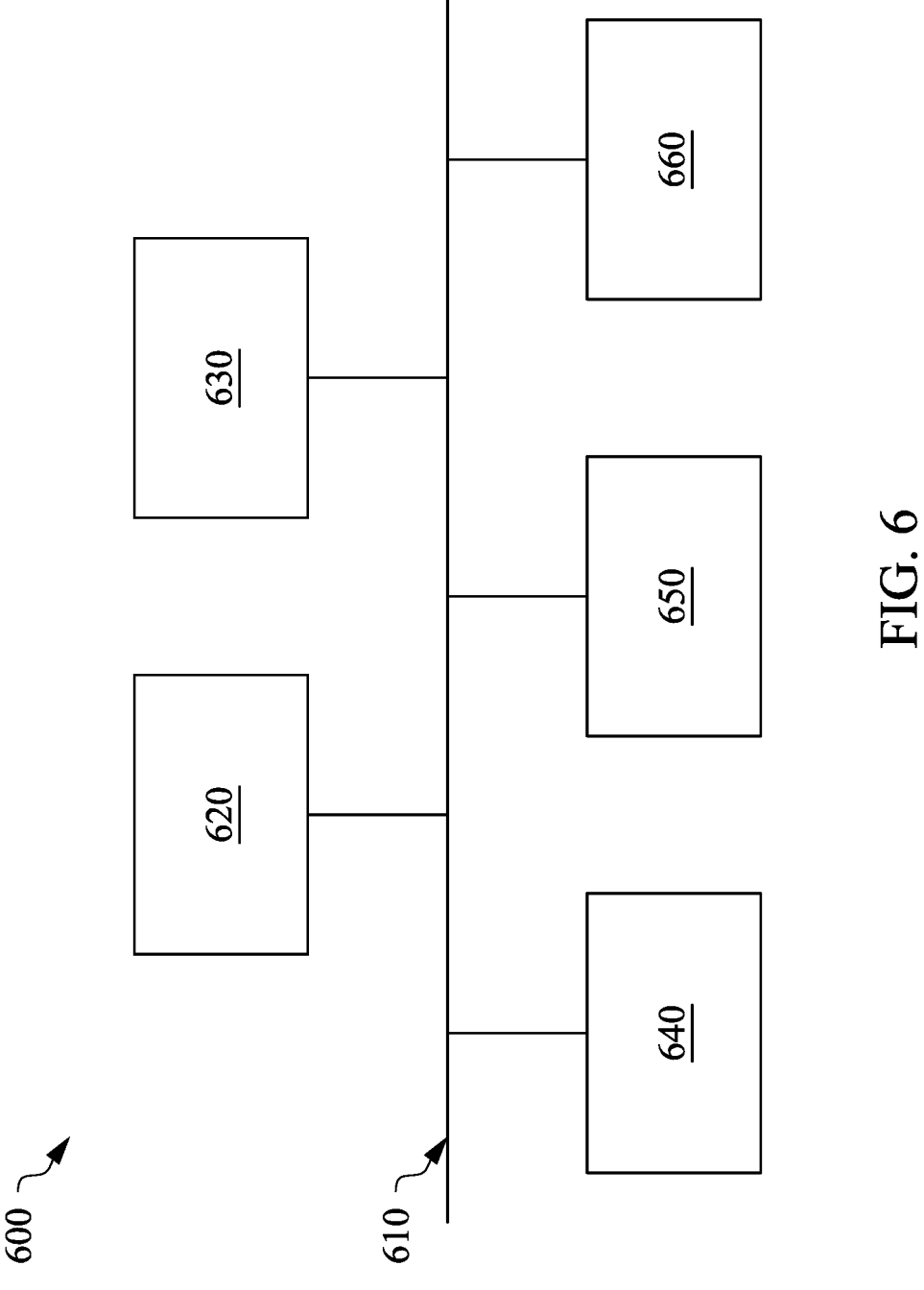
FIG. 6 is a diagram of example components of one or more devices of FIG. 1 described herein.

FIG. 6 is a diagram of example components of one or more devices of FIG. 1 described herein. In some implementations, the semiconductor processing tools 102-116 and/or the wafer/die transport tool 118 may include one or more devices 600 and/or one or more components of the device 600. As shown in FIG. 6, the device 600 may include a bus 610, a processor 620, a memory 630, an input component 640, an output component 650, and/or a communication component 660.

The bus 610 may include one or more components that enable wired and/or wireless communication among the components of the device 600. The bus 610 may couple together two or more components of FIG. 6, such as via operative coupling, communicative coupling, electronic coupling, and/or electric coupling. For example, the bus 610 may include an electrical connection (e.g., a wire, a trace, and/or a lead) and/or a wireless bus. The processor 620 may include a central processing unit, a graphics processing unit, a microprocessor, a controller, a microcontroller, a digital signal processor, a field-programmable gate array, an application-specific integrated circuit, and/or another type of processing component. The processor 620 may be implemented in hardware, firmware, or a combination of hardware and software. In some implementations, the processor 620 may include one or more processors capable of being programmed to perform one or more operations or processes described elsewhere herein.

The memory 630 may include volatile and/or nonvolatile memory. For example, the memory 630 may include random access memory (RAM), read only memory (ROM), a hard disk drive, and/or another type of memory (e.g., a flash memory, a magnetic memory, and/or an optical memory). The memory 630 may include internal memory (e.g., RAM, ROM, or a hard disk drive) and/or removable memory (e.g., removable via universal serial bus connection). The memory 630 may be a non-transitory computer-readable medium. The memory 630 may store information, one or more instructions, and/or software (e.g., one or more software applications) related to the operation of the device 600. In some implementations, the memory 630 may include one or more memories that are coupled (e.g., communicatively coupled) to one or more processors (e.g., processor 620), such as via the bus 610. Communicative coupling between a processor 620 and a memory 630 may enable the processor 620 to read and/or process information stored in the memory 630 and/or to store information in the memory 630.

The input component 640 may enable the device 600 to receive input, such as user input and/or sensed input. For example, the input component 640 may include a touch screen, a keyboard, a keypad, a mouse, a button, a microphone, a switch, a sensor, a global positioning system sensor, a global navigation satellite system sensor, an accelerometer, a gyroscope, and/or an actuator. The output component 650 may enable the device 600 to provide output, such as via display, a speaker, and/or a light-emitting diode. The communication component 660 may enable the device 600 to communicate with other devices via wired connection and/or a wireless connection. For example, the communication component 660 may include a receiver, a transmitter, a transceiver, a modem, a network interface card, and/or an antenna.

The device 600 may perform one or more operations or processes described herein. For example, a non-transitory computer-readable medium (e.g., memory 630) may store a set of instructions (e.g., one or more instructions or code) for execution by the processor 620. The processor 620 may execute the set of instructions to perform one or more operations or processes described herein. In some implementations, execution of the set of instructions, by one or more processors 620, causes the one or more processors 620 and/or the device 600 to perform one or more operations or processes described herein. In some implementations, hardwired circuitry may be used instead of or in combination with the instructions to perform one or more operations or processes described herein. Additionally, or alternatively, the processor 620 may be configured to perform one or more operations or processes described herein. Thus, implementations described herein are not limited to any specific combination of hardware circuitry and software.

The number and arrangement of components shown in FIG. 6 are provided as an example. The device 600 may include additional components, fewer components, different components, or differently arranged components than those shown in FIG. 6. Additionally, or alternatively, a set of components (e.g., one or more components) of the device 600 may perform one or more functions described as being performed by another set of components of the device 600.

FIG. 7 is a flowchart of an example process 700 associated with forming a multi-layer photodiode structure described herein. In some implementations, one or more process blocks of FIG. 7 are performed using one or more semiconductor processing tools (e.g., one or more of the semiconductor processing tools 102-116). Additionally, or alternatively, one or more process blocks of FIG. 7 may be performed using one or more components of device 600, such as processor 620, memory 630, input component 640, output component 650, and/or communication component 660.

As shown in FIG. 7, process 700 may include forming a layer of an oxide material over a substrate (block 705). For example, one or more of the semiconductor processing tools 102-116 may be used to form a layer of an oxide material (e.g., the layer of the oxide material 404) over a substrate (e.g., the substrate 312a), as described herein.

As further shown in FIG. 7, process 700 may include forming a first cavity through the layer of the oxide material into the substrate (block 710). For example, one or more of the semiconductor processing tools 102-116 may be used to form a first cavity (e.g., the cavity 502) through the layer of the oxide material into the substrate, as described herein.

As further shown in FIG. 7, process 700 may include forming a first sensing structure in the first cavity (block 715). For example, one or more of the semiconductor processing tools 102-116 may be used to form a first sensing structure (e.g., the sensing structure 316a) in the first cavity, as described herein.

As further shown in FIG. 7, process 700 may include forming doped isolation regions adjacent to sidewalls of the first sensing structure (block 720). For example, one or more of the semiconductor processing tools 102-116 may be used to form doped isolation regions (e.g., the doped isolation regions 320a) adjacent to sidewalls of the first sensing structure, as described herein.

As further shown in FIG. 7, process 700 may include forming a p-type region in the first sensing structure (block 725). For example, one or more of the semiconductor processing tools 102-116 may be used to form a p-type region (e.g., the p-type region 322a) in the first sensing structure, as described herein.

As further shown in FIG. 7, process 700 may include forming an n-type region in the first sensing structure (block 730). For example, one or more of the semiconductor processing tools 102-116 may be used to form an n-type region (e.g., the n-type region 324a) in the first sensing structure, as described herein.

As further shown in FIG. 7, process 700 may include forming a layer of a dielectric material over the first sensing structure (block 735). For example, one or more of the semiconductor processing tools 102-116 may be used to form a layer of a dielectric material (e.g., the layer of the dielectric material 406) over the first sensing structure, as described herein.

As further shown in FIG. 7, process 700 may include forming a recessed region within the layer of the dielectric material (block 740). For example, one or more of the semiconductor processing tools 102-116 may be used to form a recessed region (e.g., the recessed region 516) within the layer of the dielectric material, as described herein.

As further shown in FIG. 7, process 700 may include forming a second cavity through the layer of the dielectric material within the recessed region and through the layer of the oxide material (block 745). For example, one or more of the semiconductor processing tools 102-116 may be used to form a second cavity (e.g., the cavity 520) through the layer of the dielectric material within the recessed region and through the layer of the oxide material, as described herein.

As further shown in FIG. 7, process 700 may include forming a second sensing structure that is over the recessed region and that includes a bottom-side protrusion filling the second cavity to connect with the substrate (block 750). For example, one or more of the semiconductor processing tools 102-116 may be used to form a second sensing structure (e.g., the sensing structure 316*b*) that is over the recessed region and that includes a bottom-side protrusion (e.g., the bottom-side protrusion 408) filling the second cavity to connect with the substrate, as described herein. In some implementations, forming the second sensing structure includes forming the second sensing structure above the first sensing structure.

Process 700 may include additional implementations, such as any single implementation or any combination of implementations described below and/or in connection with one or more other processes described elsewhere herein.

In a first implementation, forming the doped isolation regions includes performing an implant operation to dope regions of the substrate adjacent to the sidewalls of the first sensing structure.

In a second implementation, alone or in combination with the first implementation, performing the implant operation includes implanting a boron dopant.

In a third implementation, alone or in combination with one or more of the first and second implementations, forming the doped isolation regions includes forming the doped isolation regions to a depth that is greater relative to a depth of the cavity.

In a fourth implementation, alone or in combination with one or more of the first through third implementations, the doped isolation regions are first isolation regions and further including forming at least one second isolation region (e.g., the doped isolation regions 320*b*) in the second sensing structure.

In a fifth implementation, alone or in combination with one or more of the first through fourth implementations, the p-type region is a first p-type region, the n-type region is a first n-type region, and further including forming a second p-type region (e.g., the p-type region 322*b*) or a second n-type region (e.g., the n-type region 324*b*) in the second sensing structure.

Although FIG. 7 shows example blocks of process 700, in some implementations, process 700 includes additional blocks, fewer blocks, different blocks, or differently arranged blocks than those depicted in FIG. 7. Additionally, or alternatively, two or more of the blocks of process 700 may be performed in parallel.

Some implementations described herein provide an opto-electronic device including a multi-layer photodiode structure. The multi-layer photodiode structure includes a stacked configuration of multiple sensing structures formed from quantum effect materials (e.g., a germanium material). By using the stacked configuration of multiple sensing structures, a quantum effect length is increased relative to another photodiode including a single layer photodiode structure.

Furthermore, a lower sensing structure of the multi-layer sensing structure may share a substrate with integrated circuitry of the optoelectronic device. The lower sensing structure is electrically isolated from the integrated circuitry by doped isolation regions adjacent to sidewalls of the lower sensing structure. Relative to another optoelectronic device including the lower sensing structure and the integrated circuitry on separate substrates, an amount resources (e.g., raw materials, semiconductor manufacturing tools, labor, and/or computing resources) needed to fabricate the opto-electronic device is reduced.

By increasing the quantum length, a performance of an optoelectronic device including the photodiode is increased relative to another optoelectronic device including a photo-diode having a single layer of a quantum effect material. By improving the performance of the optoelectronic device, a quality and a reliability of the optoelectronic device for a target application and/or environment may increase to improve a manufacturing yield and reduce a rate of field failures. Such an improved manufacturing yield and reduced rate of field failures may extend the resource savings real-ized though combining the lower sensing structure and the integrated circuitry on the substrate even further.

In this way, a performance of an optoelectronic device including the multi-layer photodiode structure is increased relative to another optoelectronic device including a photo-diode structure including the single, planar sensing structure. By improving the performance of the optoelectronic device, a quality and a reliability of the optoelectronic device for a target application and/or environment may increase to improve a manufacturing yield and reduce a rate of field failures. Improving the manufacturing yield and reducing the rate in field failures may reduce an amount of resources (e.g., raw materials, semiconductor manufacturing tools, labor, and/or computing resources) needed to support a market consuming the optoelectronic device.

As described herein, an optoelectronic device includes a multi-layer photodiode structure. The multi-layer photo-diode structure includes a stacked configuration of multiple sensing structures formed from quantum effect materials (e.g., a germanium material). By using the stacked configu-ration of multiple sensing structures, a quantum effect length is increased relative to another photodiode including a single layer photodiode structure. Furthermore, a lower sensing structure of the multi-layer sensing structure may share a substrate with integrated circuitry of the optoelectronic device. The lower sensing structure is electrically isolated from the integrated circuitry by doped isolation regions adjacent to sidewalls of the lower sensing structure. Relative to another optoelectronic device including the lower sensing structure and the integrated circuitry on separate substrates, an amount resources (e.g., raw materials, semiconductor manufacturing tools, labor, and/or computing resources), needed to fabricate the optoelectronic device is reduced.

By increasing the quantum length, a performance of an optoelectronic device including the photodiode is increased relative to another optoelectronic device including a photo-diode having a single layer of a quantum effect material. In this way, a performance of the optoelectronic device, a quality of the optoelectronic device, and a reliability of the optoelectronic device for a target application and/or envi-ronment may increase to improve a manufacturing yield and reduce a rate of field failures. Such an improved manufac-turing yield and reduced rate of field failures may extend the resource savings realized though combining the lower sens-ing structure and the integrated circuitry on the substrate even further.

As described in greater detail above, some implementa-tions described herein provide an optoelectronic device. The optoelectronic device includes a substrate. The optoelec-tronic device includes a multi-layer photodiode structure that includes a first sensing structure. The first sensing structure extends into the substrate, includes a first quantum effect material, and has sidewalls that are adjacent to doped isolation regions that are within the substrate. The multi-layer photodiode structure includes a second sensing struc-ture that is above the first sensing structure and includes a second quantum effect material. The multi-layer photodiode structure includes a layer of an oxide material that is below the second sensing structure and that is above the first sensing structure. The multi-layer photodiode structure includes a layer of a dielectric material that is above the layer of the oxide material and that is below the second sensing structure.

As described in greater detail above, some implementations described herein provide a device. The device includes a first semiconductor die that includes a first substrate and a pixel sensor that includes a multi-layer photodiode structure. The multi-layer photodiode structure includes a first sensing structure that extends into the first substrate, includes a first quantum effect material, and has sidewalls that are adjacent to doped isolation regions that are within the first substrate. The multi-layer photodiode structure includes a second sensing structure (that is above the first sensing structure and includes a second quantum effect material. The device includes a second semiconductor die joined with the first semiconductor die below the first semiconductor die. The second semiconductor die includes a second substrate and logic integrated circuitry on or within the second substrate.

As described in greater detail above, some implementations described herein provide a method. The method includes forming a layer of an oxide material over a substrate. The method includes forming a first cavity through the layer of the oxide material into the substrate. The method includes forming a first sensing structure in the first cavity. The method includes forming isolation regions adjacent to sidewalls of the first sensing structure. The method includes forming a p-type region in the first sensing structure. The method includes forming an n-type region in the first sensing structure. The method includes forming a layer of a dielectric material over the first sensing structure. The method includes forming a recessed region within the layer of the dielectric material. The method includes forming a second cavity through the layer of the dielectric material within the recessed region and through the layer of the oxide material. The method includes forming a second sensing structure that is over the recessed region and that includes a bottom-side protrusion filling the second cavity to connect with the substrate, where forming the second sensing structure includes forming the second sensing structure above the first sensing structure.

As used herein, the term "and/or," when used in connection with a plurality of items, is intended to cover each of the plurality of items alone and any and all combinations of the plurality of items. For example, "A and/or B" covers "A and B," "A and not B," and "B and not A."

As used herein, "satisfying a threshold" may, depending on the context, refer to a value being greater than the threshold, greater than or equal to the threshold, less than the threshold, less than or equal to the threshold, equal to the threshold, not equal to the threshold, or the like.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An optoelectronic device, comprising:
a substrate; and
a multi-layer photodiode structure comprising:
a first sensing structure that extends into the substrate, includes a first quantum effect material, and has sidewalls that are adjacent to doped isolation regions that are within the substrate;
a second sensing structure that is above the first sensing structure and includes a second quantum effect material;
a layer of an oxide material that is below the second sensing structure and that is above the first sensing structure; and
a layer of a dielectric material that is above the layer of the oxide material and that is below the second sensing structure,
wherein the second sensing structure comprises a bottom-side protrusion that extends into the substrate.

2. The optoelectronic device of claim 1, wherein the the bottom-side protrusion extends downwards through the layer of the dielectric material and through the layer of the oxide material.

3. The optoelectronic device of claim 1, wherein the substrate comprises:
a silicon-on-insulator structure.

4. The optoelectronic device of claim 1, wherein the layer of the dielectric material comprises:
an iron oxide material, or
a zinc oxide material.

5. The optoelectronic device of claim 1, wherein a thickness of the second sensing structure is lesser relative to a thickness of the first sensing structure.

6. The optoelectronic device of claim 1, further comprising:
an electromagnetic wave transmissive region that is vertically arranged, includes the first sensing structure, and has a same approximate width as the first sensing structure.

7. The optoelectronic device of claim 6, wherein the second sensing structure is contained outside the electromagnetic wave transmissive region.

8. The optoelectronic device of claim 6, wherein the second sensing structure extends laterally into the electromagnetic wave transmissive region.

9. A device, comprising:
a first semiconductor die, comprising:
a first substrate; and
a pixel sensor, comprising:
a multi-layer photodiode structure, comprising:
a first sensing structure that extends into the first substrate, includes a first quantum effect material, and has sidewalls that are adjacent to doped isolation regions that are within the first substrate; and
a second sensing structure that is above the first sensing structure and includes a second quantum effect material; and
a second semiconductor die joined with the first semiconductor die below the first semiconductor die and comprising:
a second substrate; and
logic integrated circuitry on or within the second substrate,
wherein the second sensing structure comprises a bottom-side protrusion that extends into the first substrate.

10. The device of claim 9, wherein the first sensing structure comprises:
a p-type region, and
an n-type region.

11. The device of claim 9, wherein the second sensing structure comprises:

a p-type region, and an n-type region.

12. The device of claim 9, wherein the first quantum effect material and the second quantum effect material each comprises:

a type III material, or a type V material.

13. The device of claim 9, wherein the doped isolation regions are first doped isolation regions, and wherein the second sensing structure comprises:

second doped isolation regions.

14. The device of claim 13, further comprising:

a layer of an epitaxial material over the second sensing structure, and third doped isolation regions, wherein the third doped isolation regions are within the layer of the epitaxial material.

15. A method, comprising:

forming a layer of an oxide material over a substrate;

forming a first cavity through the layer of the oxide material into the substrate;

forming a first sensing structure in the first cavity;

forming doped isolation regions adjacent to sidewalls of the first sensing structure;

forming a p-type region in the first sensing structure;

forming an n-type region in the first sensing structure;

forming a layer of a dielectric material over the first sensing structure;

forming a recessed region within the layer of the dielectric material;

forming a second cavity through the layer of the dielectric material within the recessed region, through the layer of the oxide material, and into the substrate; and forming a second sensing structure that is over the recessed region and that includes a bottom-side protrusion filling the second cavity to extend into the substrate, wherein forming the second sensing structure includes forming the second sensing structure above the first sensing structure.

16. The method of claim 15, wherein forming the doped isolation regions comprise:

performing an implant operation to dope regions of the substrate that are adjacent to the sidewalls of the first sensing structure.

17. The method of claim 16, where performing the implant operation comprises:

implanting a boron dopant.

18. The method of claim 15, wherein forming the doped isolation regions comprises:

forming the doped isolation regions to a depth that is greater relative to a depth of the first cavity.

19. The method of claim 15, wherein the doped isolation regions are first isolation regions and further comprising:

forming at least one second isolation region in the second sensing structure.

20. The method of claim 15, wherein the p-type region is a first p-type region, the n-type region is a first n-type region, and further comprising:

forming a second p-type region or a second n-type region in the second sensing structure.

\* \* \* \* \*